US009929188B2

United States Patent
Shimoda et al.

(10) Patent No.: US 9,929,188 B2
(45) Date of Patent: Mar. 27, 2018

(54) METHOD FOR PRODUCING FUNCTIONAL DEVICE AND APPARATUS FOR PRODUCING FUNCTIONAL DEVICE

(71) Applicant: Japan Science and Technology Agency, Saitama (JP)

(72) Inventors: Tatsuya Shimoda, Ishikawa (JP); Toshihiko Kaneda, Nagano (JP)

(73) Assignee: Japan Science and Technology Agency, Saitama (JP)

( * ) Notice: Subject to any disclaimer, the term of this patent is extended or adjusted under 35 U.S.C. 154(b) by 495 days.

(21) Appl. No.: 14/357,138

(22) PCT Filed: Nov. 7, 2012

(86) PCT No.: PCT/JP2012/078849
§ 371 (c)(1),
(2) Date: May 8, 2014

(87) PCT Pub. No.: WO2013/069686
PCT Pub. Date: May 16, 2013

(65) Prior Publication Data
US 2015/0004762 A1     Jan. 1, 2015

(30) Foreign Application Priority Data
Nov. 9, 2011    (JP) ................................ 2011-245922

(51) Int. Cl.
*B44C 1/22*        (2006.01)
*H01L 27/12*      (2006.01)
(Continued)

(52) U.S. Cl.
CPC .......... *H01L 27/1255* (2013.01); *B41J 2/161* (2013.01); *B41J 2/1623* (2013.01); *B41J 2/1628* (2013.01);
(Continued)

(58) Field of Classification Search
CPC .......... B81C 2201/0191; B29C 59/002; B29C 59/02; B41J 2/1637; B41J 2/1645
(Continued)

(56) References Cited

U.S. PATENT DOCUMENTS 7,453,206 B2    11/2008   Fujitani et al.
7,955,461 B2     6/2011   Mase et al.
(Continued)

FOREIGN PATENT DOCUMENTS

CN          1529896 A      9/2004
JP      2006121029 A      5/2006
(Continued)

OTHER PUBLICATIONS

Wikipedia, the Free Encyclopedia; "Atmosphere of Earth" via https://web.archive.org/web/20100823065554/http://en.wikipedia.org/wiki/Atmosphere_of_Earth ; pp. 1-7; 2010.*
(Continued)

*Primary Examiner* — Binh X Tran
(74) *Attorney, Agent, or Firm* — Seed IP Law Group LLP

(57) ABSTRACT

According to the present invention, a method of producing a functional device includes the imprinting step and the functional solid material layer formation step. In the imprinting step, a functional solid material precursor layer obtained from a functional solid material precursor solution as a start material is imprinted so that a first temperature of a heat source for supplying heat to the functional solid material precursor layer is higher than a second temperature of the functional solid material precursor layer in at least part of a time period while a mold for forming an imprinted structure is pressed against the functional solid material precursor layer. In the functional solid material layer formation step, after the imprinting step, the functional solid material precursor layer is heat treated at a third temperature
(Continued)

higher than the first temperature in an atmosphere containing oxygen to form a functional solid material layer from the functional solid material precursor layer.

18 Claims, 15 Drawing Sheets

(51) Int. Cl.

| | | |
|---|---|---|
| H01L 45/00 | (2006.01) | |
| H01L 41/09 | (2006.01) | |
| H01L 41/317 | (2013.01) | |
| H01L 41/332 | (2013.01) | |
| H01L 29/786 | (2006.01) | |
| B41J 2/16 | (2006.01) | |
| H01L 21/67 | (2006.01) | |
| H01L 27/108 | (2006.01) | |
| H01L 21/28 | (2006.01) | |
| H01L 29/78 | (2006.01) | |
| H01L 49/02 | (2006.01) | |

(52) U.S. Cl.
CPC ........... *B41J 2/1629* (2013.01); *B41J 2/1637* (2013.01); *B41J 2/1645* (2013.01); *H01L 21/67098* (2013.01); *H01L 27/10805* (2013.01); *H01L 27/10873* (2013.01); *H01L 27/127* (2013.01); *H01L 27/1262* (2013.01); *H01L 29/7869* (2013.01); *H01L 41/0973* (2013.01); *H01L 41/317* (2013.01); *H01L 41/332* (2013.01); *H01L 45/1206* (2013.01); *H01L 45/1226* (2013.01); *H01L 45/147* (2013.01); *H01L 45/1608* (2013.01); *H01L 21/28291* (2013.01); *H01L 28/55* (2013.01); *H01L 29/78391* (2014.09)

(58) Field of Classification Search
USPC ...................................................... 216/54, 55
See application file for complete search history.

(56) References Cited

U.S. PATENT DOCUMENTS

| | | | | |
|---|---|---|---|---|
| 2005/0013989 A1* | 1/2005 | Hirose | ................... | C23C 24/08 428/323 |
| 2006/0266734 A1* | 11/2006 | Fujii | ................... | B29C 31/008 216/44 |
| 2009/0233237 A1* | 9/2009 | Yoshiki | ................... | H05K 3/106 430/311 |
| 2010/0051172 A1 | 3/2010 | Kim et al. | | |
| 2010/0065189 A1 | 3/2010 | Mase et al. | | |
| 2010/0072665 A1* | 3/2010 | Imai | ................... | B29C 33/02 264/293 |
| 2010/0233309 A1* | 9/2010 | Chou | ................... | B29C 33/62 425/385 |
| 2012/0021304 A1* | 1/2012 | Satake | ................... | B28B 11/10 429/408 |
| 2012/0030916 A1* | 2/2012 | Takahashi | ............. | H01L 41/338 29/25.35 |
| 2013/0240871 A1 | 9/2013 | Shimoda et al. | | |

FOREIGN PATENT DOCUMENTS

| | | | | |
|---|---|---|---|---|
| JP | 2007168294 A | 7/2007 | | |
| JP | 2010-52419 A | 3/2010 | | |
| JP | 2010052419 A | 3/2010 | | |
| JP | 20110238714 A | 11/2011 | | |
| WO | 2010-030032 A1 | 3/2010 | | |
| WO | 2010030032 A1 | 3/2010 | | |
| WO | 2010110395 A1 | 9/2010 | | |
| WO | WO 2010110395 A1 * | 9/2010 | ............. | B28B 11/10 |
| WO | WO 2010123108 A1 * | 10/2010 | ............ | H01L 41/338 |

OTHER PUBLICATIONS

Wikipedia the Free Encyclopedia "Methanol" via https://en.wikipedia.org/wiki/Methanol ; pp. 1-13; 2016.*
Wikipedia the Free Encyclopedia, "Ethanol" via https://en.wikipedia.org/wiki/Ethanol ; pp. 1-30, 2016.*
Wikipedia the Free Encyclopedia; "Isopropyl Alcohol" via https://en.wikipedia.org/wiki/Isopropyl_alcohol ; pp. 1-7; 2016.*
Wikipedia, the Free Encyclopidia, "Field Effect Transistor" via https://en.wikipedia.org/wiki/Field-effect_transistor ; pp. 1-9; 2016.*
Office Action, dated Mar. 19, 2015, for corresponding CN Application No. 201280055282.4, 13 pages (with English translation).
Office Action dated Oct. 20, 2015, for JP 2011-245922, (JP with English translation), 16 pages.
Chinese Office Action, with English translation, dated Nov. 13, 2015, for Chinese Application No. 201280055282.4, 6 pages.
Office Action, dated Feb. 11, 2015, for corresponding TW Application No. 101141470, 3 pages.
Office Action, dated Feb. 11, 2015, for corresponding TW Application No. 101141470, 4 pages. (English Translation).
International Search Report, dated Jan. 29, 2013, for PCT/JP2012/078849, 7 pages.

* cited by examiner

[Fig.1]
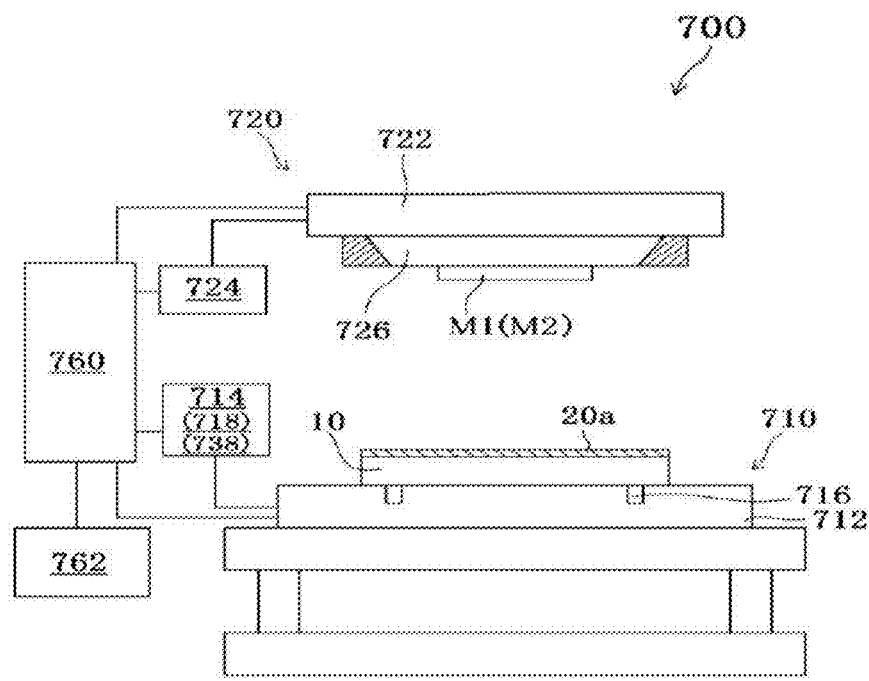
[Fig.2A]
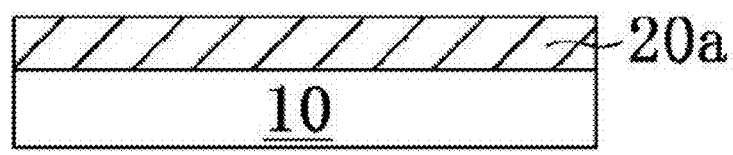

[Fig.2B]
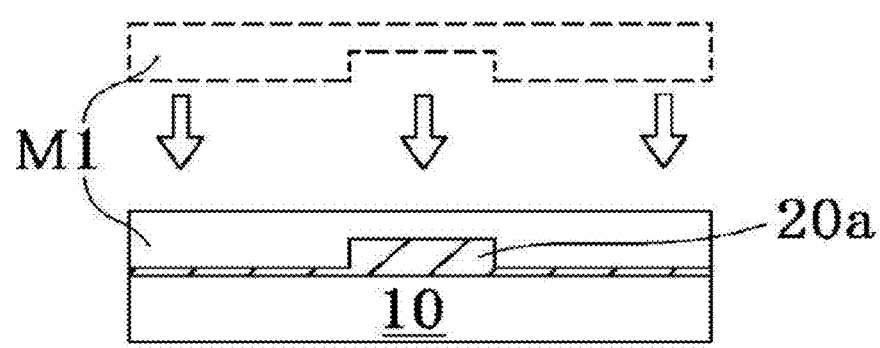
[Fig.2C]
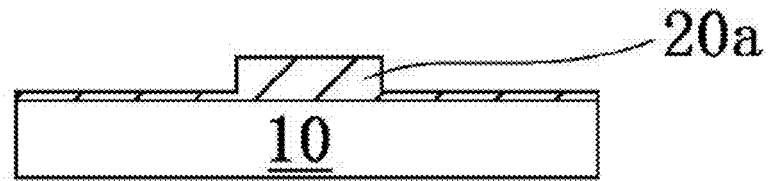

[Fig.2D]
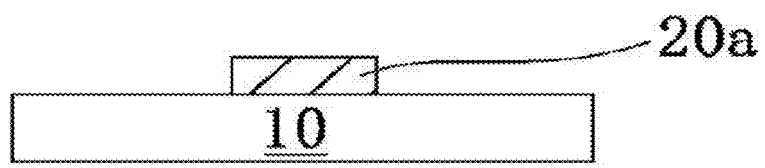
[Fig.2E]
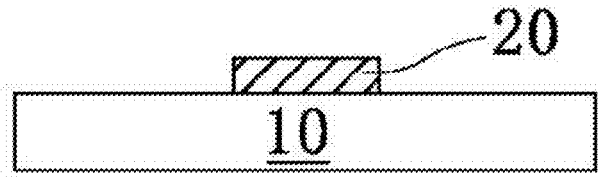

[Fig.2F]
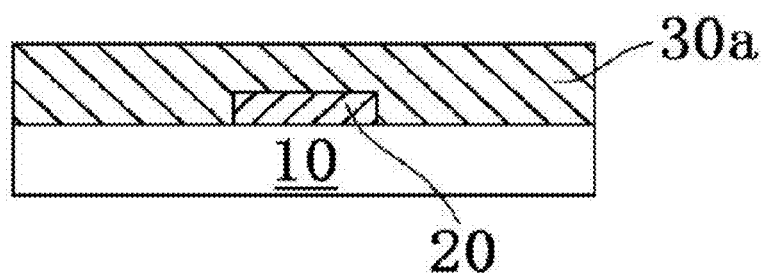
[Fig.2G]
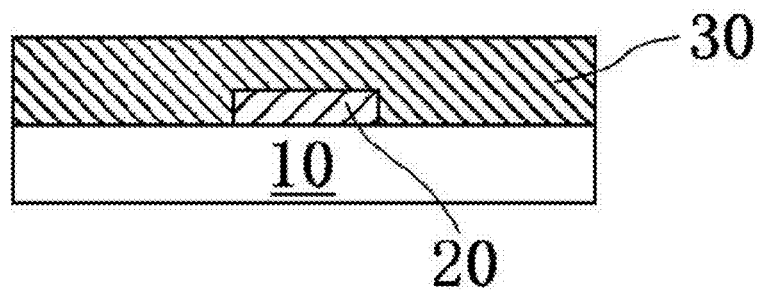

[Fig.2H]
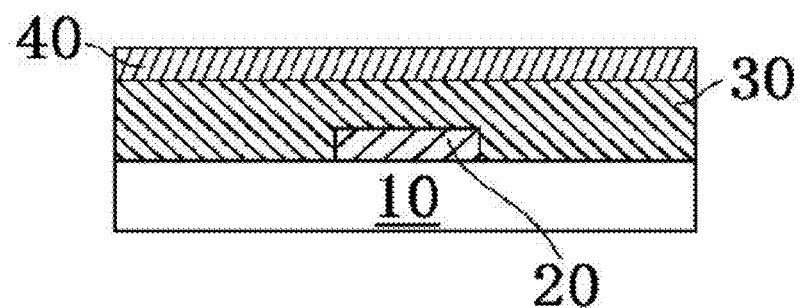
[Fig.2J]
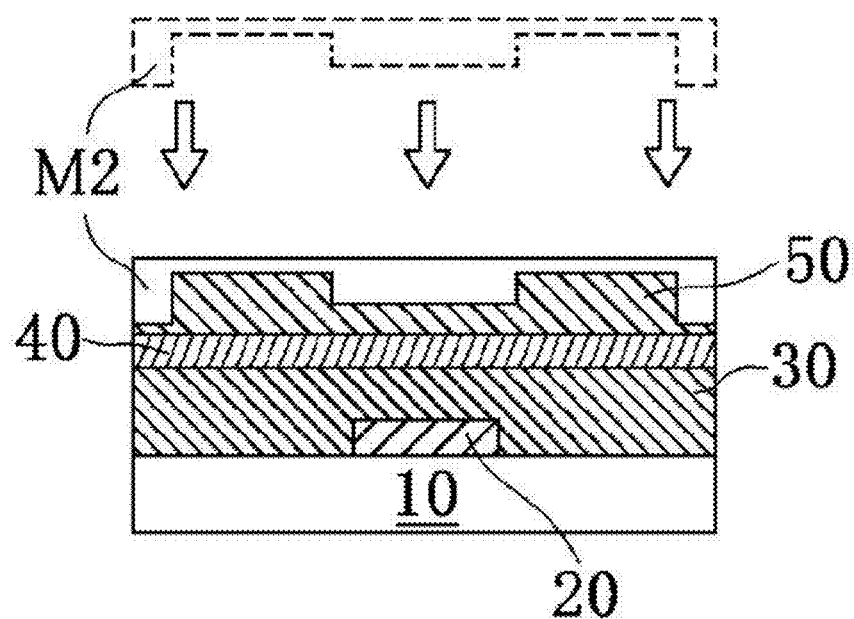

[Fig. 2K]
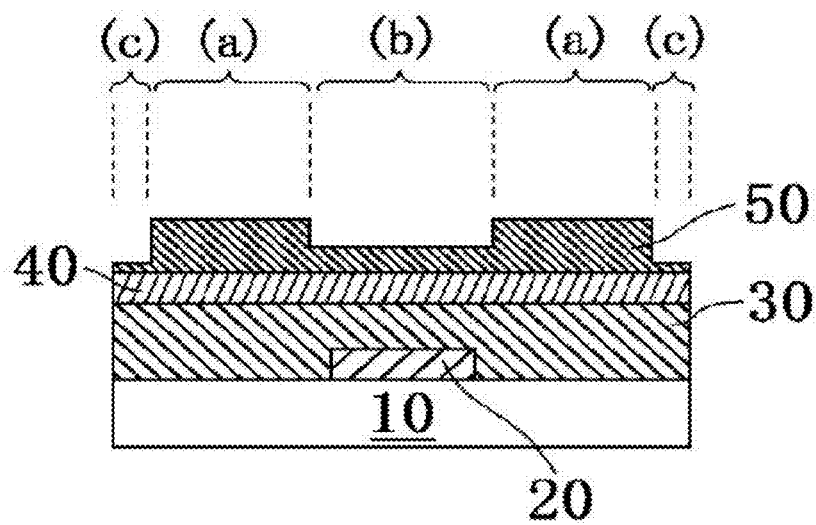
[Fig. 2L]
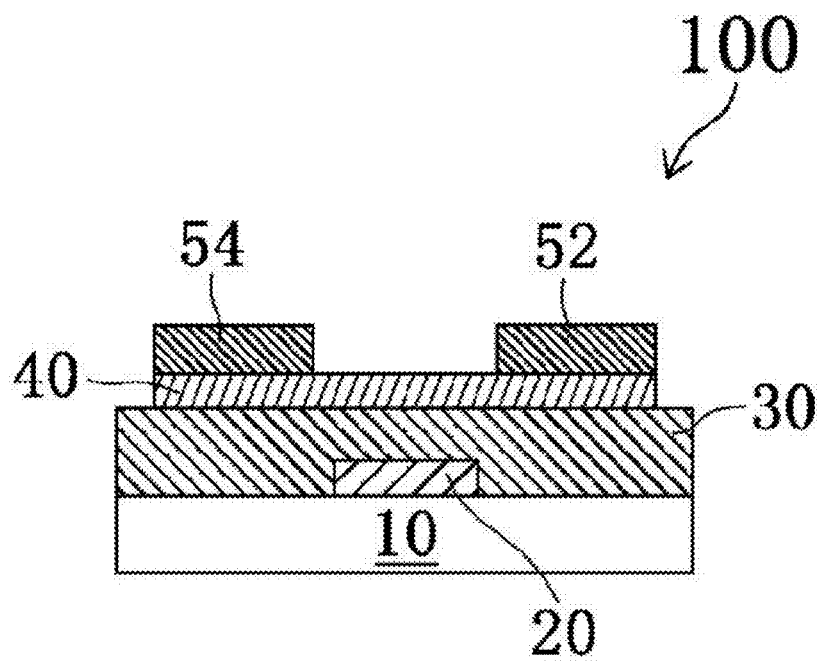

[Fig.3]
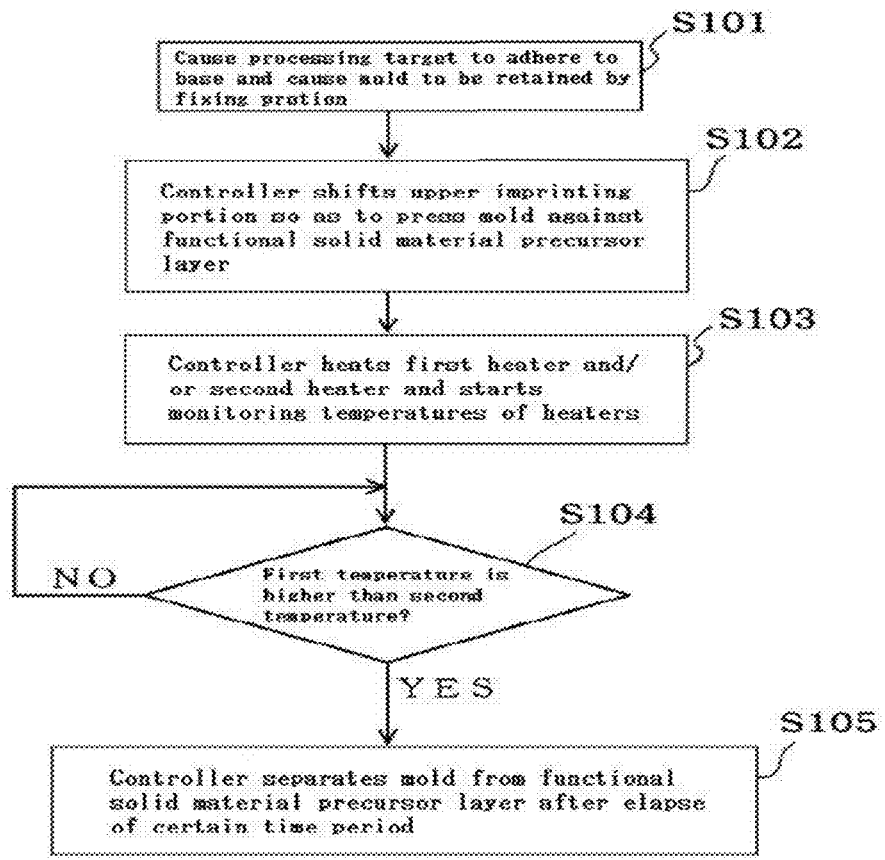
[Fig.4]
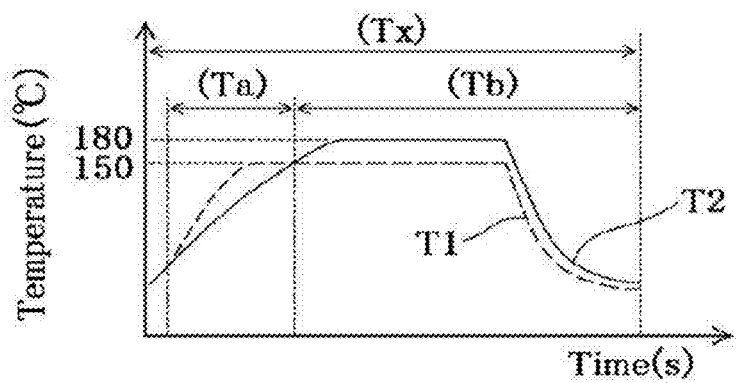

[Fig.5]
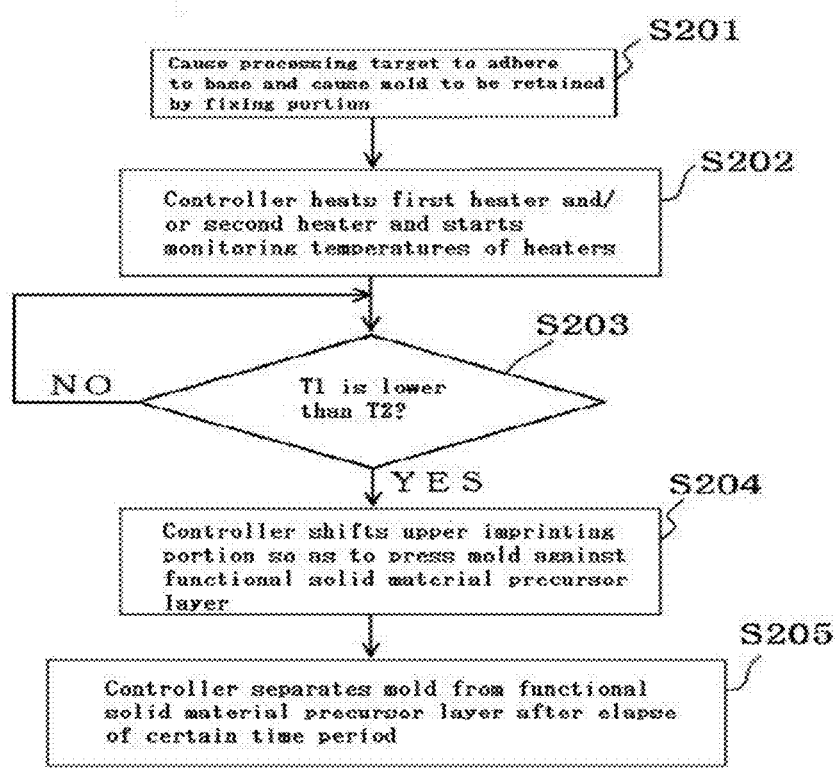
[Fig.6]
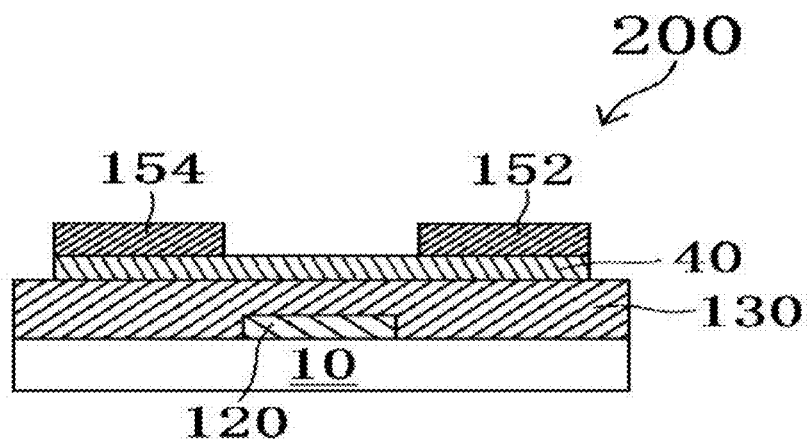

[Fig.7]
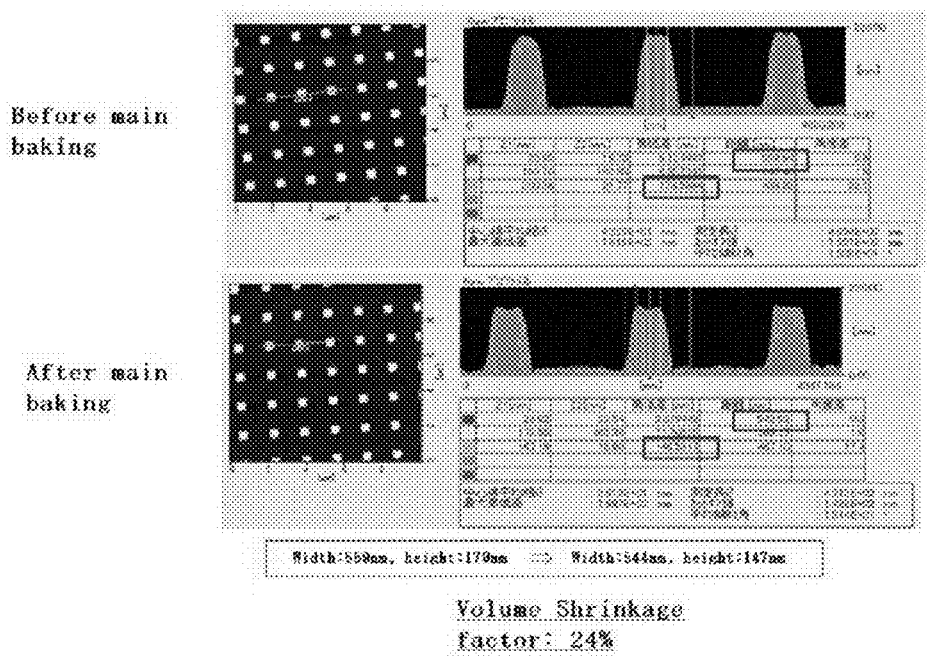
[Fig.8]
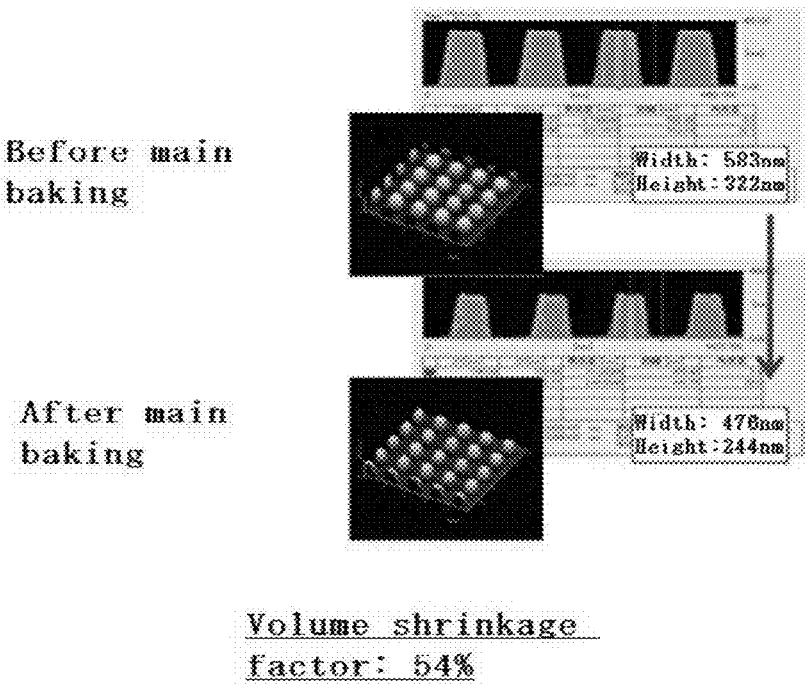

[Fig.9]
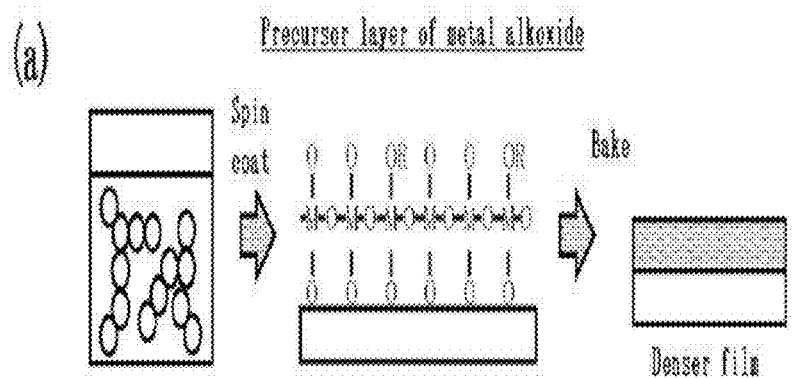
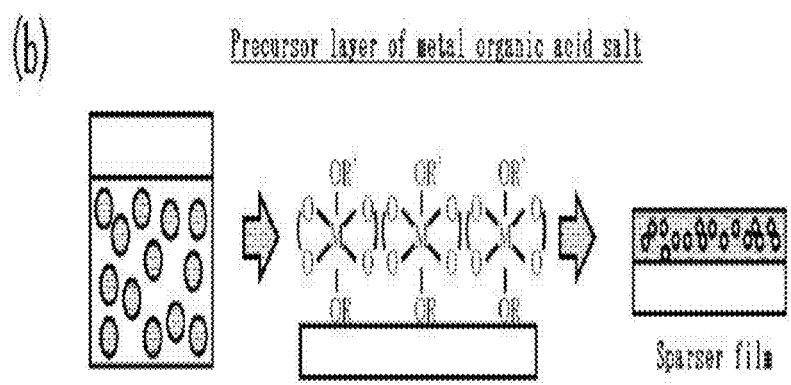
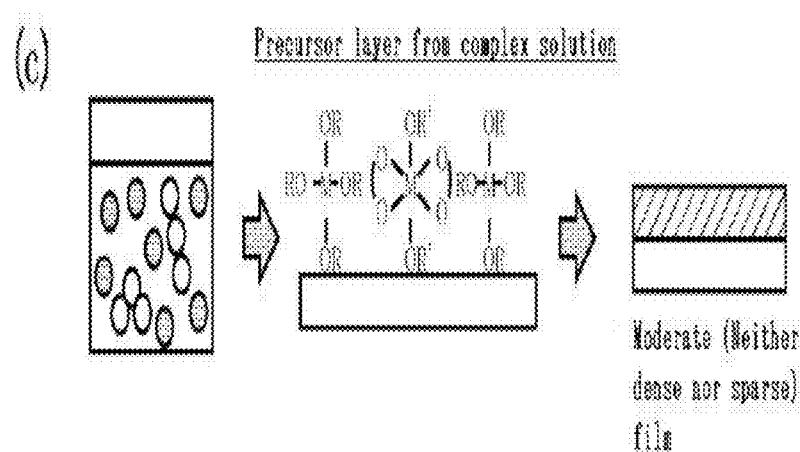

[Fig.10]
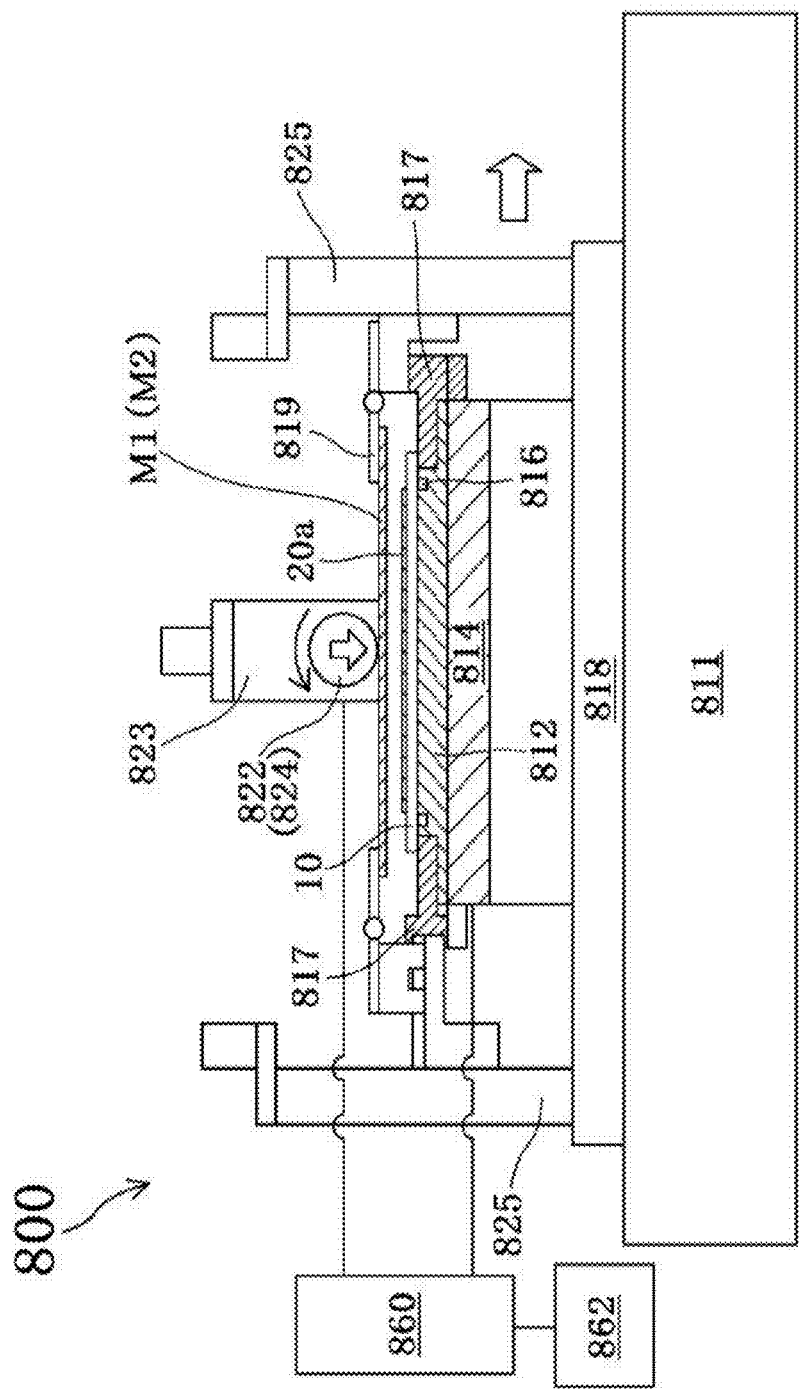

[Fig.11]
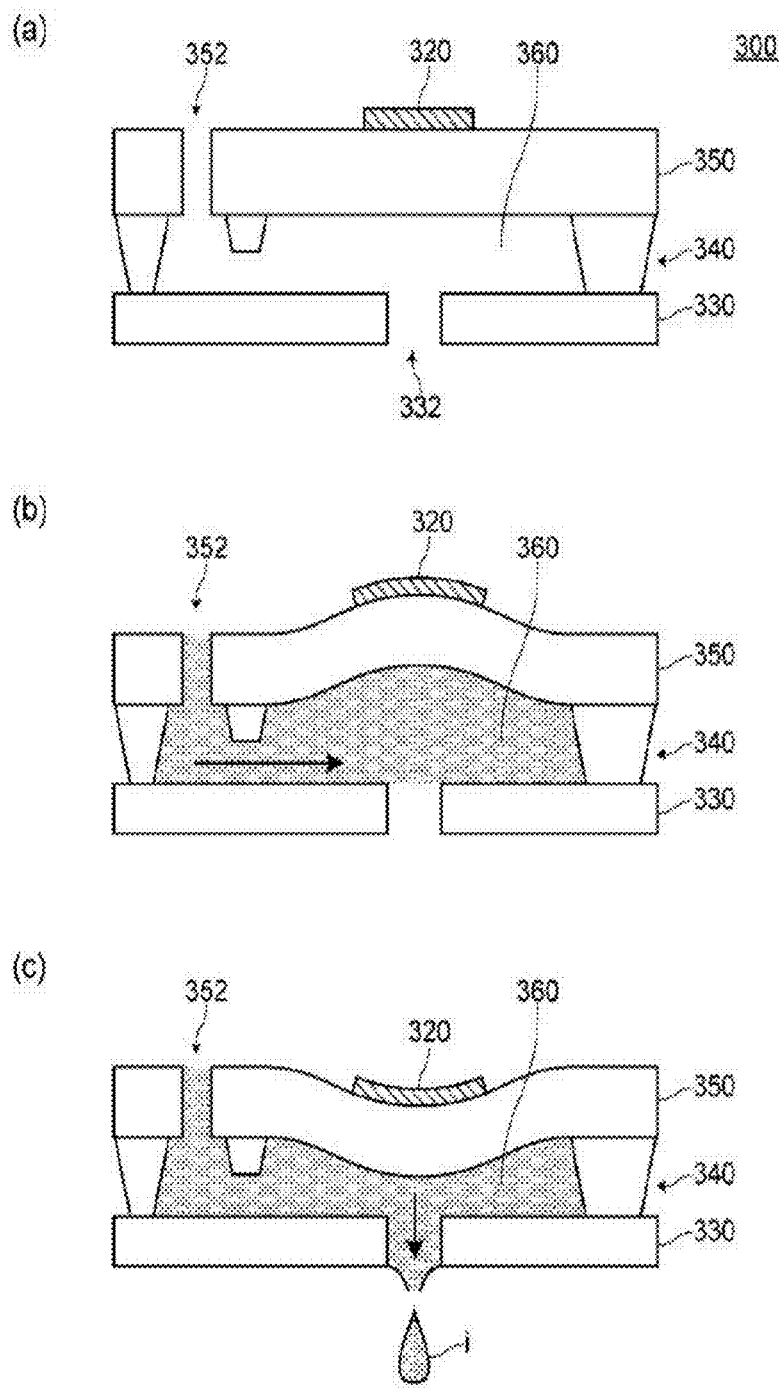

[Fig.12]
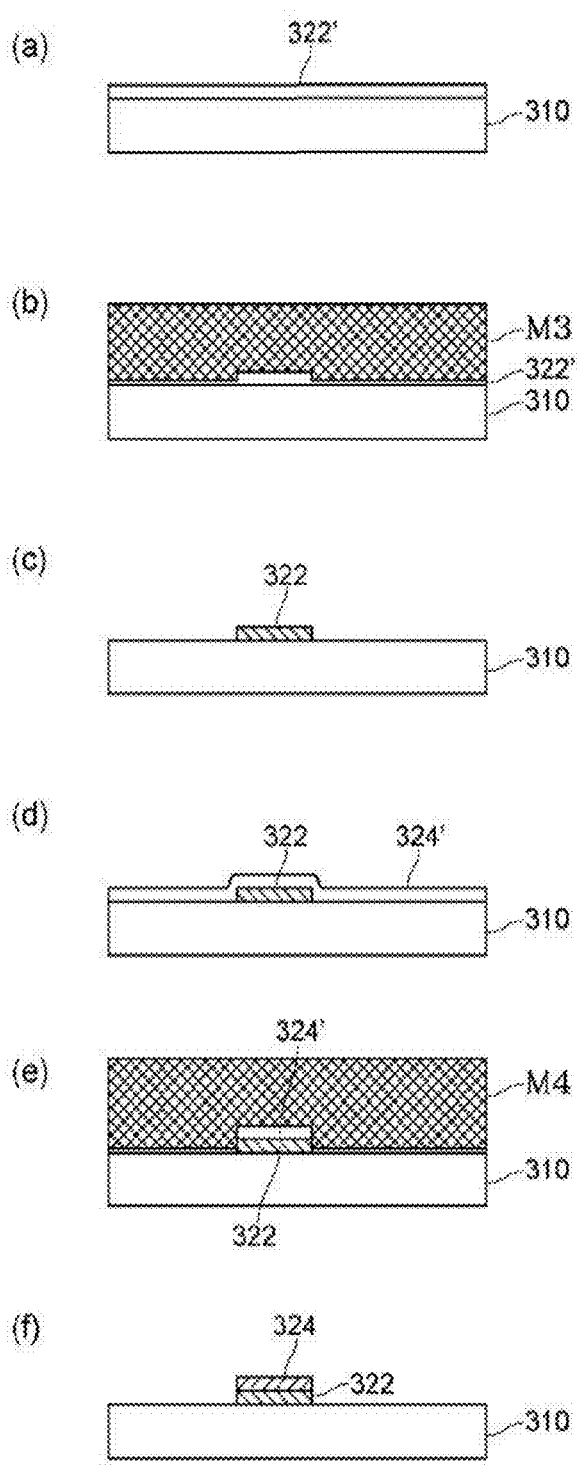

[Fig.13]
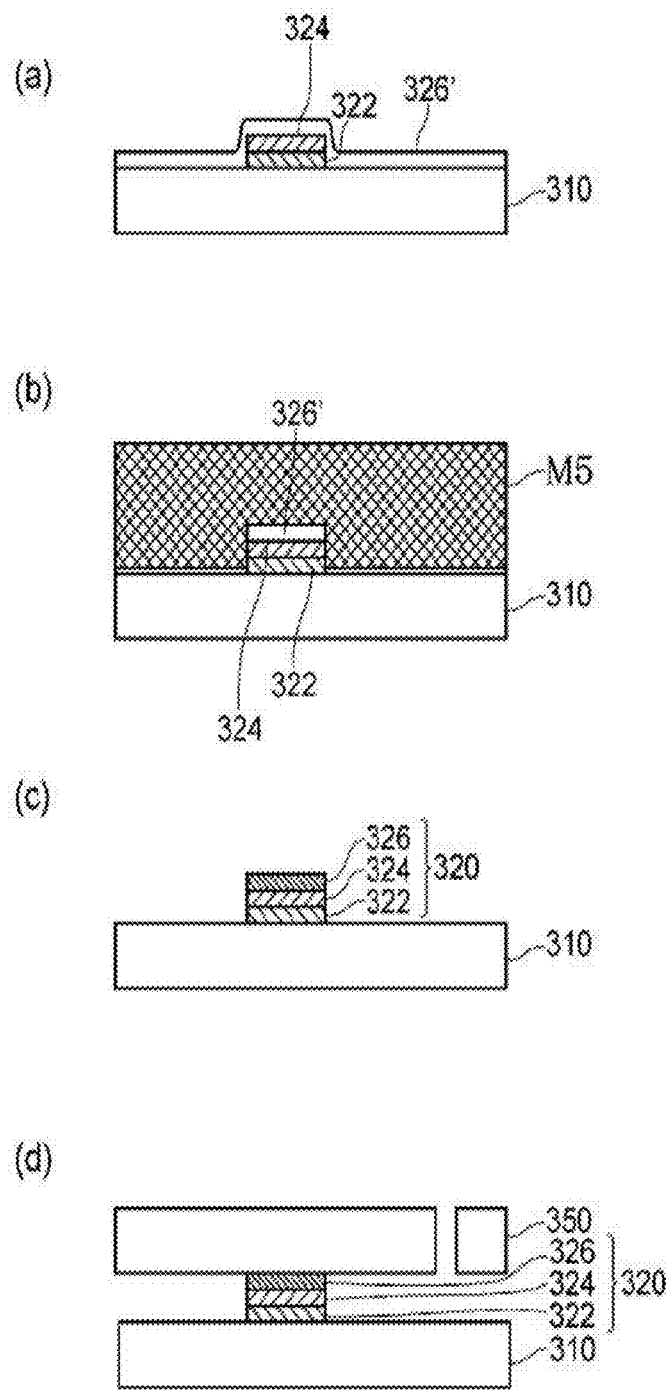

[Fig.14]
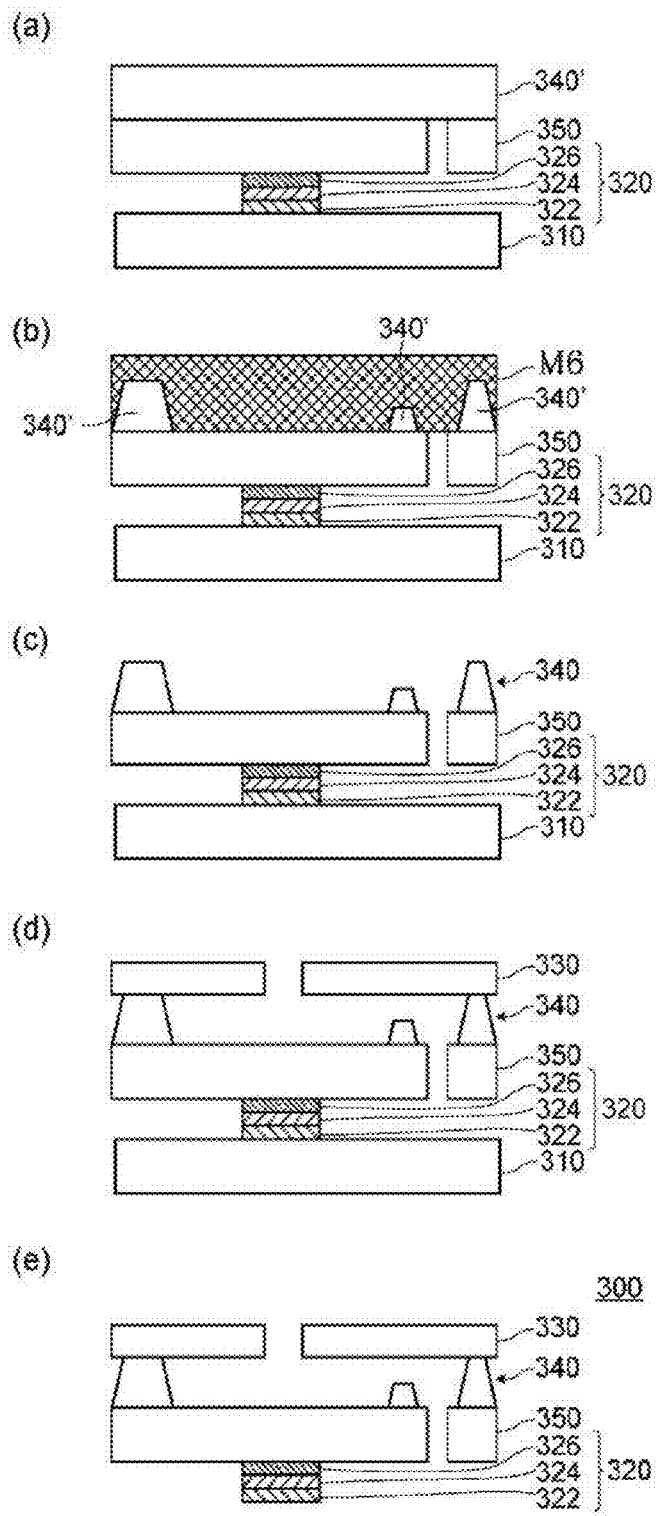

__US 9,929,188 B2__

METHOD FOR PRODUCING FUNCTIONAL DEVICE AND APPARATUS FOR PRODUCING FUNCTIONAL DEVICE

TECHNICAL FIELD

The present invention relates to a method of producing a functional device and an apparatus for producing the functional device.

BACKGROUND ART

There has been conventionally disclosed a thin film transistor that includes a gate insulating layer containing a ferroelectric material (e.g. BLT ($Bi_{4-X}La_XTi_3O_{12}$) or PZT ($Pb(Zr_X, Ti_{1-X})O_3$)) in order to enable rapid switching at a low drive voltage. Meanwhile, in order to increase carrier density, there has been also disclosed a thin film transistor that includes a channel layer containing an oxide conductive material (e.g. indium tin oxide (ITO), zinc oxide (ZnO), or LSCO ($La_XSr_{1-X}CuO_4$)) (Patent Document 1).

In a method of producing the thin film transistor mentioned above, a gate electrode of laminated films made of Ti and Pt is formed in accordance with the electron-beam evaporation technique. The gate insulating layer made of BLT or PZT is formed on the gate electrode in accordance with the sol-gel method. The channel layer made of ITO is further formed on the gate insulating layer in accordance with the RF-sputtering technique. Subsequently formed on the channel layer are Ti and Pt as a source electrode and a drain electrode in accordance with the electron-beam evaporation technique. An element region is then isolated from a different element region in accordance with the RIE method and the wet etching method (a mixed solution of HF and HCI) (Patent Document 1).

PRIOR ART DOCUMENT

Patent Document

Patent Document 1: JP 2006-121029 A

SUMMARY OF THE INVENTION

Problems to be Solved by the Invention

There have been exemplified several conventional thin film transistors each including a gate insulating layer or a channel made of complex oxide. However, further development is still required so as to select a material achieving high properties as a thin film transistor and an appropriate production method therefor.

Furthermore, the conventional technique typically includes a process that takes relatively long time and/or requires expensive equipment, such as the vacuum process or a process in accordance with the photolithography technique. These processes lead to quite low utilization ratios of raw materials and production energy. When adopting the production method described above, production of a thin film transistor requires many processes and takes long time, which is not preferred from the industrial and mass productivity perspectives. The conventional technique also causes the problem that increase in area is relatively difficult to achieve.

These problems apply not only to the method of producing a thin film transistor. For example, these problems can apply generally to methods of producing functional devices of one type, such as memory transistors typically exemplified as a flash memory, a ferroelectric memory (FeRAM), and a magnetic memory (MRAM), a capacitor, a piezoelectric ink jet head, an optical device, as well as MEMS devices including an actuator, an ink jet head, an actuator, a pressure sensor, an acceleration sensor, and a flow path module.

The present invention solves at least one of the problems mentioned above, to achieve improvement in performance of a functional device such as the thin film transistor or the capacitor, or simplification and energy saving in the processes of producing such a functional device. The present invention thus contributes significantly to provision of a functional device that is excellent from the industrial and mass productivity perspectives.

Solutions to the Problems

The inventors of this application have gone through close researches and analyses in order to form an oxide layer usable in a functional device such as a thin film transistor or a capacitor, in accordance with the "imprinting" technique, which is also called the "nanoimprinting" technique. In the course of the researches, the inventors found that it is possible to form an imprinted structure more certainly and/or accurately by applying special arrangement upon supply of heat to a material to be imprinted. The inventors thus found that it is possible to form such oxide layers and produce a functional device including the oxide layers by a process that achieves remarkable simplification or energy saving as well as facilitates increase in area as compared with the conventional technique. The present invention has been devised in view of these points.

According to the present invention, a method of producing a functional device includes the imprinting step and the functional solid material layer formation step. Specifically, the method of producing a functional device includes the imprinting step of imprinting a functional solid material precursor layer obtained from a functional solid material precursor solution as a start material so that a first temperature of a heat source for supplying heat to the functional solid material precursor layer is higher than a second temperature of the functional solid material precursor layer in at least part of a time period while a mold for forming an imprinted structure is pressed against the functional solid material precursor layer. The method of producing a functional device further includes the functional solid material layer formation step of forming, after the imprinting step, a functional solid material layer from the functional solid material precursor layer by heat treating the functional solid material precursor layer at a third temperature higher than the first temperature in an atmosphere containing oxygen.

According to the method of producing a functional device, in at least part of the time period for the imprinting, heat is supplied to the functional solid material precursor layer from the heat source having the temperature (first temperature) higher than the temperature (second temperature) of the functional solid material precursor layer. Although the particular molding mechanism in the imprinting is not clarified at the present stage, the inventors have found that positive supply or transfer of heat to the functional solid material precursor layer in the imprinting step can contribute with fine repeatability to improvement in moldability of the functional solid material precursor layer as well as to molding at a relatively low temperature. The functional solid material precursor layer is then heat treated at the third temperature higher than the first temperature. It is thus possible to form the functional solid material layer having the imprinted structure that is much more certain and/or accurate, as compared with a case of imprinting the functional solid material precursor layer with no consideration of heat. It is thus possible to produce a functional device that includes a functional solid material layer having such an imprinted structure. Furthermore, according to the method of producing a functional device, there is no need to adopt a process requiring relatively long time and/or expensive equipment, such as the vacuum process, a process in accordance with the photolithography technique, or the ultraviolet irradiation process. Moreover, the functional solid material layer is formed by the heat treatment and the imprinting at a relatively low temperature with no need for any of the above processes. This method is thus excellent from the industrial and mass productivity perspectives.

Moreover, an apparatus for producing a functional device according to the present invention includes a controller, an imprinting portion, and a heat treatment portion. Specifically, the apparatus for producing a functional device includes the controller for controlling so that a first temperature of a heat source for supplying heat to a functional solid material precursor layer obtained from a functional solid material precursor solution as a start material is higher than a second temperature of the functional solid material precursor layer in at least part of a time period while a mold for forming an imprinted structure is pressed against the functional solid material precursor layer. The apparatus for producing a functional device further includes the imprinting portion for imprinting the functional solid material precursor layer. The apparatus for producing a functional device also includes the heat treatment portion for heat treating the functional solid material precursor layer having the imprinted structure at a third temperature higher than the first temperature in an atmosphere containing oxygen to form a functional solid material layer from the functional solid material precursor layer.

In the apparatus for producing a functional device, using the controller and the imprinting portion, in at least part of the time period for the imprinting, heat is supplied to the functional solid material precursor layer from the heat source having the temperature (first temperature) higher than the temperature (second temperature) of the functional solid material precursor layer. Although the particular mechanism is not clarified at the present stage as already described, the inventors have found that positive supply or transfer of heat to the functional solid material precursor layer in the imprinting step can contribute with fine repeatability to improvement in moldability of the functional solid material precursor layer as well as to molding at a relatively low temperature. Furthermore, the heat treatment portion heat treats the functional solid material precursor layer at the third temperature higher than the first temperature. It is thus possible to form the functional solid material layer having the imprinted structure that is much more certain and/or accurate, as compared with a case of imprinting the functional solid material precursor layer with no consideration of heat. It is thus possible to produce a functional device that includes a functional solid material layer having such an imprinted structure. Furthermore, in the apparatus for producing a functional device, there is no need for relatively long time and/or for expensive equipment such as a device necessary for the vacuum process or the photolithography technique or a device necessary for ultraviolet irradiation. Moreover, the functional solid material layer is formed by the imprinting portion and the heat treatment portion each having a relatively low temperature. The apparatus is thus excellent from the industrial and mass productivity perspectives.

There is no particular limitation to the "heat source" in each of the aspects of the present invention. Typical examples thereof include a heater for heating, from inside or from outside, a mold used for imprinting, and a heater for heating, from inside or from outside, a base that allows a substrate having a functional solid material precursor layer to be mounted thereon. Other examples of the "heat source" for supplying heat to the functional solid material precursor layer include known means utilizing radiation heat and known means utilizing microwaves.

The "functional solid material precursor solution" in this application typically includes at least one selected from the group consisting of a solution containing metal alkoxide, a solution containing a metal organic acid salt, a solution containing a metal inorganic acid salt, a solution containing metal halide, a solution containing an inorganic compound containing metal, nitrogen, and hydrogen, a solution containing metal hydride, a solution containing metal nanoparticles, and particulate ceramics. Solutes in these solutions or any solutes possibly altered when these solutions are formed into layers correspond to the "functional solid material precursor" in this application. The "functional solid material precursor layer" in this application accordingly indicates a layer or a film (collectively called a "layer" in this application) of the "functional solid material precursor".

Typical examples of the "functional solid material precursor layer" in this application include: a precursor layer to be formed after main baking as at least one selected from the group consisting of a gate electrode layer, a gate insulating layer (ferroelectric layer), a source layer, a drain layer, a channel layer, and a wiring layer in a thin film transistor or a memory transistor; a precursor layer to be formed as at least one selected from the group consisting of a piezoelectric layer and an electrode layer in an actuator such as a piezoelectric ink jet head; a precursor layer to be formed as a dielectric layer and/or an electrode layer in a capacitor; or a precursor layer to be formed as a latticed layer in an optical device. Typical examples of the "functional solid material layer" thus include: at least one selected from the group consisting of a gate electrode layer, a gate insulating layer (ferroelectric layer), a source layer, a drain layer, a channel layer, and a wiring layer in a thin film transistor or a memory transistor; at least one selected from the group consisting of a piezoelectric layer and an electrode layer in an actuator such as a piezoelectric ink jet head; a dielectric layer in a capacitor; and a latticed layer in an optical device. As already described, functional devices of the one type include a thin film transistor, a memory transistor, a piezoelectric ink jet head, a capacitor, an optical device, and a MEMS device (including an actuator). The "functional solid material precursor layer" or the "functional solid material layer" described above can accordingly include a precursor layer or a solid material layer that can be partially included in these functional devices of the one type.

The "functional solid material precursor solutions", the "functional solid material precursors", and the "functional solid materials" formed therefrom can each include inevitable impurities. In order to simplify the disclosure, such inevitable impurities are not discussed in the following embodiments.

The "volume shrinkage factor" in this application is a value obtained by dividing a "value obtained by subtracting a volume after shrinkage in the functional solid material layer formation step from a volume prior to shrinkage after the imprinting step" by a "volume prior to shrinkage after the imprinting step". In other words, the degree of shrinkage is higher as the volume shrinkage factor is larger.

Effects of the Invention

A method of producing a functional device according to the present invention or an apparatus for producing a functional device according to the present invention achieves formation of a functional solid material layer that has a much more certain and/or accurate imprinted structure. Furthermore, a method of producing a functional device according to the present invention or an apparatus for producing a functional device according to the present invention enables molding at a relatively low temperature. It is thus possible to produce a functional device that includes a functional solid material layer having such an imprinted structure. Moreover, the functional solid material layer is formed by the heat treatment and the imprinting at a relatively low temperature in the method of producing a functional device. This method is thus excellent from the industrial and mass productivity perspectives.

BRIEF DESCRIPTION OF THE DRAWINGS

FIG. 1 is a view of a configuration of an apparatus for producing a functional device according to a first embodiment of the present invention.

FIG. 2A is a sectional schematic view of a process in a method of producing a thin film transistor according to the first embodiment of the present invention.

FIG. 2B is a sectional schematic view of a process in the method of producing the thin film transistor according to the first embodiment of the present invention.

FIG. 2C is a sectional schematic view of a process in the method of producing the thin film transistor according to the first embodiment of the present invention.

FIG. 2D is a sectional schematic view of a process in the method of producing the thin film transistor according to the first embodiment of the present invention.

FIG. 2E is a sectional schematic view of a process in the method of producing the thin film transistor according to the first embodiment of the present invention.

FIG. 2F is a sectional schematic view of a process in the method of producing the thin film transistor according to the first embodiment of the present invention.

FIG. 2G is a sectional schematic view of a process in the method of producing the thin film transistor according to the first embodiment of the present invention.

FIG. 2H is a sectional schematic view of a process in the method of producing the thin film transistor according to the first embodiment of the present invention.

FIG. 2I is a sectional schematic view of a process in the method of producing the thin film transistor according to the first embodiment of the present invention.

FIG. 2K is a sectional schematic view of a process in the method of producing the thin film transistor according to the first embodiment of the present invention.

FIG. 2L is a sectional schematic view of a process in the method of producing the thin film transistor according to the first embodiment of the present invention.

FIG. 3 is a flowchart of the imprinting step as part of the steps of producing the functional device according to the first embodiment of the present invention.

FIG. 4 is a graph indicating temporal variation in temperature of each of first and second heaters in the imprinting step as part of the steps of producing the functional device according to the first embodiment of the present invention.

FIG. 5 is a flowchart of the imprinting step as part of the steps of producing a functional device according to a modification example of the first embodiment of the present invention.

FIG. 6 is a sectional schematic view of a memory transistor according to a modification example (3) of the first embodiment of the present invention.

FIG. 7 shows exemplary measurement results, using an atomic force microscope (AFM), of a patterned functional solid material precursor layer and a functional solid material layer after main baking according to a modification example (7) of the first embodiment of the present invention.

FIG. 8 shows exemplary measurement results, using the atomic force microscope (AFM), of a different patterned functional solid material precursor layer and a different functional solid material layer after main baking according to the modification example (7) of the first embodiment of the present invention.

FIGS. 9(a) to 9(c) are assumption views each showing a typical gel state and final oxide in order to indicate a reaction process mechanism depending on a difference in material for a precursor.

FIG. 10 is a view of a configuration of an apparatus for producing a functional device according to a modification example (8) of the first embodiment of the present invention.

FIGS. 11(a) to 11(c) are explanatory views of a piezoelectric ink jet head according to a second embodiment of the present invention.

FIGS. 12(a) to 12(f) are explanatory views each showing part of a method of producing the piezoelectric ink jet head according to the second embodiment of the present invention.

FIGS. 13(a) to 13(d) are explanatory views each showing part of the method of producing the piezoelectric ink jet head according to the second embodiment of the present invention.

FIGS. 14(a) to 14(e) are explanatory views each showing part of the method of producing the piezoelectric ink jet head according to the second embodiment of the present invention.

DESCRIPTION OF REFERENCE SIGNS 10 substrate
20 gate electrode layer
20a gate electrode precursor layer
30a gate insulating layer precursor layer
30 gate insulating layer
40 channel oxide layer
50 drain electrode oxide layer
50a drain electrode precursor layer
52 drain electrode
54 source electrode
100 thin film transistor
120 gate electrode layer
130 ferroelectric layer
200 memory transistor
300 piezoelectric ink jet head
320 piezoelectric element
322 first electrode
324 piezoelectric layer
326 second electrode
326' functional solid material (LNO) precursor layer
330 nozzle plate
332 nozzle opening 340 cavity component
340' functional solid material (quartz glass) precursor layer
350 vibration plate
352 ink supply port
360 ink chamber
700,800 apparatus for producing functional device
710 upper imprinting portion
712,812 base
714 first heater
716,816 suction portion
718 preliminary baking portion
720 lower imprinting portion
722 fixing portion
724 second heater
726 quartz glass
738 main baking heater
760,860 controller
762,862 computer
811 apparatus seat
814 base heater
817 lift
818 shifting seat
819 mold retainer
822 roller
823 roller retainer
824 roller heater
825 mold retaining stage
M1 gate electrode mold
M2 source/drain electrode mold
M3,M4,M5,M6 mold

EMBODIMENTS OF THE INVENTION

A thin film transistor 100 exemplifying a functional device and a method of producing the same according to an embodiment of the present invention, and an apparatus 700 for producing a functional device according to the embodiment of the present invention are described in detail with reference to the accompanying drawings. In this disclosure, common parts are denoted by common reference signs in all the drawings unless otherwise specified. Furthermore, components according to the present embodiment are not necessarily illustrated in accordance with relative scaling in the drawings. Moreover, some of the reference signs may not be indicated for the purpose of easier recognition of the respective drawings.

First Embodiment

FIG. 1 is a view of a configuration of the apparatus 700 for producing a functional device according to the present embodiment. FIGS. 2A to 2J are sectional schematic views each showing a process in the method of producing the thin film transistor 100 according to the present embodiment. The figure subsequent to FIG. 2H is denoted by 2J in order for easy distinction of letters. Although the thin film transistor according to the present embodiment has a so-called bottom gate structure, the present embodiment is not limited to this structure. If a person skilled in the art having ordinary technical knowledge refers to the disclosure of the present embodiment, the person is capable of forming a top gate structure by changing the orders of the steps. Moreover, patterning of an extraction electrode from each electrode is not illustrated in order to simplify the drawings.

Configuration of Apparatus 700 for Producing Functional Device

As shown in FIG. 1, the apparatus 700 for producing a functional device according to the present embodiment are roughly divided into three constituent parts, and includes an upper imprinting portion 720, a lower imprinting portion 710, and a controller 760 therefor.

Specifically, at the upper imprinting portion 720, quartz glass 726 fixed by a fixing portion 722 retains a gate electrode mold M1 or the like, for imprinting a functional solid material precursor layer. Furthermore, in the present embodiment, the fixing portion 722 is connected with a heat source for supplying heat to the functional solid material precursor layer upon imprinting, namely, a second heater 724 for heating the gate electrode mold M1 or the like. The upper imprinting portion 720 includes a pressure sensor for monitoring press force of the gate electrode mold M1 or the like toward a known lift mechanism (not shown) and the functional solid material precursor layer upon imprinting. This pressure sensor can be alternatively included in the lower imprinting portion 710 to be described later.

At the lower imprinting portion 710, there is mounted, on a base 712, an SiO$_2$/Si substrate (hereinafter, also simply referred to as the "substrate") 10 having a functional solid material precursor layer to be processed (e.g. a gate electrode precursor layer 20a). The substrate 10 is sucked from a suction portion 716 by a pump (not shown) so as to adhere to the base 712. Furthermore, in the present embodiment, the base 712 is connected with another heat source for supplying heat to the functional solid material precursor layer upon imprinting, namely, a first heater 714 for heating the substrate 10 and the functional solid material precursor layer. The first heater 714 according to the present embodiment also serves as a preliminary baking portion 718 for preliminarily baking (also called the "drying step") the functional solid material precursor layer. In the present embodiment, the lower imprinting portion 710 including the preliminary baking portion 718 thus serves as the preliminary baking portion of the apparatus 700 for producing a functional device. In a different possible aspect, the preliminary baking portion 718 is provided separately from the first heater 714.

The apparatus 700 for producing a functional device according to the present embodiment further includes the controller 760 and a computer 762 connected to the controller 760. The controller 760 performs various control upon imprinting, inclusive of controlling vertical shift of the mold using the upper imprinting portion 720 by known feedback control, controlling press force of the mold, controlling the temperature of the first heater 714, and controlling the temperature of the second heater 724. This computer 762 monitors or totally controls processes of the constituent parts in accordance with a functional device production program for execution of a series of processes in the present embodiment using the respective constituent parts. In the present embodiment, this functional device production program is stored in a hard disk drive in the computer or in a known recording medium such as an optical disk inserted into an optical disk drive or the like provided to the computer. The functional device production program is not necessarily stored in these locations. For example, this functional device production program can be partially or entirely stored in the controller 760 according to the present embodiment. This functional device production program can also monitor or control the respective processes through a local area network, an Internet connection, or the like, according to a known technique.

Steps of Producing Thin Film Transistor 100

Described next are the steps of producing the thin film transistor 100 exemplifying a functional device. FIGS. 2A to 2J are sectional schematic views each showing a process in the method of producing the thin film transistor 100 according to the present embodiment. A functional solid material layer according to each of the following embodiments is formed by baking a functional solid material precursor layer obtained from a functional solid material precursor solution as a start material. In this application, the above method of forming a functional solid material layer by baking a precursor solution as a start material is also called the "solution technique" for the convenience purpose.

(1) Formation of Gate Electrode

Preliminary Baking Step

In the present embodiment, as shown in FIG. 2A, the gate electrode precursor layer 20a is initially formed on the substrate 10 in accordance with the known spin coating technique, using, as a start material, a precursor solution, particularly, a functional solid material precursor solution (a gate electrode precursor solution in this case) containing, as solutes, a precursor containing indium (In) (e.g. indium chloride or indium acetylacetonate) and a precursor containing tin (Sn) (e.g. tin chloride). The controller 760 then causes the preliminary baking portion 718 to heat to preliminarily bake the gate electrode precursor layer 20a in the atmosphere for about five minutes so as to reach 150° C. A preliminary baking temperature is preferably in the range from 80° C. to 250° C. It is possible to use, in addition to the above exemplary precursors, a precursor containing indium (In) such as indium isopropoxide, indium acetate, or indium 2-ethylhexanoate. Examples of the precursor containing tin (Sn) can include tin acetylacetonate and tin 2-ethylhexanoate.

The preliminary baking temperature is set in the range from 80° C. to 250° C. for the following reasons. Firstly, if the preliminary baking temperature is less than 80° C., the gate electrode precursor layer 20a cannot be dried sufficiently, and it is difficult to uniformly imprint the gate electrode precursor layer 20a in the imprinting step. On the other hand, if the preliminary baking temperature exceeds 250° C., the gate electrode precursor layer 20a is solidified excessively and cannot be softened sufficiently (to adequately enhance the plastic deformability of the gate electrode precursor layer 20a) in the imprinting step. It is thus difficult to achieve the sufficient effects of the imprinting. Accordingly, in order to solidify the precursor layer to some extent and preliminarily decrease fluidity of the precursor layer, the preliminary baking temperature is more preferably set in the range from 120° C. to 250° C. The above preferred temperature ranges for preliminary baking are applicable not only to the gate electrode precursor layer 20a but also to other precursor layers to be described later. Duplicate disclosure will not be provided repeatedly.

Imprinting Step

Thereafter, the imprinting step is executed as shown in FIG. 2B in order to pattern the gate electrode. In the present embodiment, as shown in FIG. 1, the imprinting is performed while the controller 760 connected with the computer 762 shifts the upper imprinting portion 720 and controls the temperatures of the upper imprinting portion 720 and the lower imprinting portion 710. Specific processes are described below with reference to the flowchart in FIG. 3 of the imprinting step as part of the steps of producing a functional device (the thin film transistor 100 in the present embodiment).

As shown in FIG. 3, initially in step S101, the substrate 10 having a functional solid material precursor layer to be processed in the imprinting step (e.g. the gate electrode precursor layer 20a) is made to adhere to the base 712. Furthermore, the fixing portion 722 retains the gate electrode mold M1 or the like with the quartz glass 726 being interposed therebetween.

Subsequently in step S102, the controller 760 shifts downward the upper imprinting portion 720. The gate electrode mold M1 is then pressed against the gate electrode precursor layer 20a, for example. The imprinting in the present embodiment is performed using a mold with the pressure of 8 MPa.

In step S103, simultaneously when or immediately after the mold is pressed against the functional solid material precursor layer in step S102, the controller 760 starts heating the first heater 714 and the second heater 724. The controller 760 heats the first heater 714 and the second heater 724 and starts monitoring the temperatures of the first heater 714 and the second heater 724. As described above, when the first heater 714 heats, the substrate 10 and the functional solid material precursor layer are heated. Furthermore, when the second heater 724 heats, a mold (e.g. the gate electrode mold M1) is heated. Accordingly, in the present embodiment, the temperature of the first heater 714 for supplying heat to the base 712 is assumed to be equal to the temperature of the base 712 unless otherwise specified. Similarly, the temperature of the second heater 724 for supplying heat to the mold is assumed to be equal to the temperature of the mold unless otherwise specified. Moreover, the execution orders of the steps S102 and S103 can be switched with each other in a different possible aspect.

FIG. 4 is a graph indicating temporal variation in temperature of each of the first heater 714 and the second heater 724 in the imprinting step as part of the steps of producing a functional device according to the present embodiment. In FIG. 4, a dotted line indicates the variation in temperature of the first heater 714 and a solid line indicates the variation in temperature of the second heater 724. In the imprinting step according to the present embodiment, the mold is separated from the functional solid material precursor layer when the temperatures of the first heater 714 and the second heater 724 are decreased sufficiently. In the imprinting step according to the present embodiment, the mold is pressed against the functional solid material precursor layer for a time period denoted by Tx in FIG. 4.

As indicated in FIG. 4, the temperature (T1) of the first heater 714 increases faster than the temperature (T2) of the second heater 724 in an early stage. There is thus provided a time zone (denoted by Ta in FIG. 4) while the temperature (T1) of the first heater 714 is higher than the temperature (T2) of the second heater 724. In the present embodiment, however, the highest temperature (T2) of the second heater 724 is preliminarily set to 180° C. and the highest temperature (T1) of the first heater 714 is preliminarily set to 150° C. There is thus provided a time zone (denoted by Tb in FIG. 4) while the temperature (T2) of the second heater 724 is higher than the temperature (T1) of the first heater 714. In the time zone Ta in FIG. 4 in the present embodiment, the functional solid material precursor layer (e.g. the gate electrode precursor layer 20a) is thus supplied with heat more positively from the base 712. In the time zone Tb in FIG. 4, the functional solid material precursor layer is supplied with heat more positively from the mold.

In step S104, the controller 760 monitors the temperatures of the first heater 714 and the second heater 724, and determines whether or not a temperature (first temperature)

of heat supplied to the functional solid material precursor layer is higher than a temperature (second temperature) of the functional solid material precursor layer while the mold is pressed against the functional solid material precursor layer.

Thereafter, when the controller 760 finds that the first temperature is higher than the second temperature, in step S105, the controller 760 causes the mold to be separated from the functional solid material precursor layer after elapse of a certain time period. The "certain time period" in the present embodiment is substantially equal to "part of a time period" to be mentioned later. Furthermore, before the mold is separated from the functional solid material precursor layer, the step of rapidly or gradually decreasing the temperature of the mold can be executed where appropriate as in the present embodiment.

The imprinting is performed in the present embodiment in a state where the temperature (first temperature) of heat supplied to the functional solid material precursor layer is higher than the temperature (second temperature) of the functional solid material precursor layer during part of a time period (the sum of Ta and Tb) in the time period (Tx) while the mold is pressed against the functional solid material precursor layer. More specifically, in the time zone Ta, the imprinting is performed in the state where the temperature (first temperature) of the first heater 714 is higher than the temperature (second temperature) of the functional solid material precursor layer heated by the mold. In the time zone Tb, however, the imprinting is performed in the state where the temperature (first temperature) of the mold is higher than the temperature (second temperature) of the functional solid material precursor layer heated by the first heater 714. In other words, the base (the first heater 714) serves as the "heat source" during the time zone Ta while the mold (the second heater 724) serves as the "heat source" during the time zone Tb in the present embodiment. When the temperature (T1) of the first heater 714 is differentiated from the temperature (T2) of the second heater 724 in this manner, heat is likely to be supplied or transferred positively from the heat source to the functional solid material precursor layer. This feature can thus contribute with fine repeatability to improvement in moldability of the functional solid material precursor layer as well as to molding at a relatively low temperature.

In the present embodiment, the ratio of the part of the time period (the sum of Ta and Tb) to the time period (Tx) while the mold is pressed against the functional solid material precursor layer is at least 95 if the time period (Tx) while the mold is pressed is assumed to be 100. The ratio is not limited to this numerical value. For example, the part of the time period is preferably at least 20 when the time period while the mold is pressed is assumed to be 100. If the part of the time period is less than 20, heat is transferred insufficiently, which is not preferred. Furthermore, the part of the time period is preferably at least 60 seconds. It is because the functional solid material precursor layer is unlikely to have an imprinted structure in such a short time period of less than 60 seconds.

As described above, the imprinting is performed using the gate electrode mold M to form the gate electrode precursor layer 20*a* that includes a thicker layer portion of about 100 to 300 nm thick and a thinner layer portion of about 10 to 100 nm thick, as shown in FIG. 2C.

The gate electrode precursor layer 20*a* is then entirely etched as shown in FIG. 2D, so that the gate electrode precursor layer 20*a* is removed in the regions other than a region corresponding to a gate electrode (the step of entirely etching the gate electrode precursor layer 20*a*). The etching step according to the present embodiment is executed in accordance with the wet etching technique without including the vacuum process. The etching can be possibly performed using plasma, in other words, in accordance with the dry etching technique. It is alternatively possible to use the technique of performing the plasma process at the atmospheric pressure.

Heat Treatment (Main Baking) Step

The gate electrode precursor layer 20*a* is thereafter heated for about 15 minutes to be mainly baked in the oxygen atmosphere (e.g. 100% by volume, but not limited thereto; this applies to the "oxygen atmosphere" to be described later). As shown in FIG. 2E, there is thus formed, on the substrate 10, an oxide layer containing indium (In) and tin (Sn), namely, a gate electrode layer 20 as a functional solid material layer. The oxide layer containing indium (In) and tin (Sn) is also called an indium tin oxide (ITO) layer.

In the present embodiment, the controller 760 heats the first heater 714 also serving as a main baking heater 738 so as to mainly bake the gate electrode precursor layer 20*a* on the substrate 10. In the present embodiment, the lower imprinting portion 710 including the main baking heater 738 thus serves as a heat treatment portion of the apparatus 700 for producing a functional device. In a different possible aspect, the main baking heater 738 is provided separately from the first heater 714. In a different possible aspect, the main baking heater 738 is replaced with a rapid thermal annealing (RTA) device so that the gate electrode precursor layer 20*a* is heat treated. This RTA device can be used for other main baking.

The temperature of the first heater 714 is 500° C. upon the main baking in the present embodiment. A temperature (third temperature in the present embodiment) of the first heater 714 upon the main baking is higher than the highest temperature (the first temperature in the present embodiment) of the second heater 724 in the imprinting step by 320° C. to 350° C.

As described above, performing the imprinting using the gate electrode mold M1 and then performing the main baking achieve formation of a functional solid material layer that has a significantly certain and/or accurate imprinted structure.

In a more preferred aspect of the preliminary baking step and the imprinting step, the preliminary baking temperature for formation of a functional solid material precursor layer is set to be in the range from 80° C. to 250° C. and the first temperature is made higher than the preliminary baking temperature as well as is set to be in the range from 90° C. to 300° C. The preliminary baking in this temperature range can evaporate a solvent in the functional solid material precursor layer and can cause a preferred gel state for exerting properties that enable future plastic deformation (possibly a state where organic chains remain before thermal decomposition). In this state, setting to the first temperature in the temperature range can contribute with fine repeatability to improvement in moldability of the functional solid material precursor layer as well as to molding at a relatively low temperature. In view of the above, the most preferred preliminary baking temperature is in the range from 100° C. to 200° C. and the most preferred first temperature is in the range from 150° C. to 300° C. It is thus preferred to include the preliminary baking portion and the controller that enable these conditions.

In a possible preferred aspect, the following conditions (1) and (2) are satisfied in the preliminary baking step and the imprinting step, in order to further facilitate imprinting the functional solid material precursor layer.

(1) The preliminary baking temperature for formation of the functional solid material precursor layer in the preliminary baking step is made lower than the boiling point of the solvent of the functional solid material precursor solution.

(2) The first temperature in the imprinting step is made higher than the boiling point of the solvent of the functional solid material precursor solution.

Examples of the possible precursor containing indium (In) include indium acetate, indium nitrate, indium chloride, and any indium alkoxide (e.g. indium isopropoxide, indium butoxide, indium ethoxide, or indium methoxyethoxide). Examples of the possible precursor containing tin (Sn) include tin acetate, tin nitrate, tin chloride, and any tin alkoxide (e.g. tin isopropoxide, tin butoxide, tin ethoxide, or tin methoxyethoxide).

The gate electrode layer 20 according to the present embodiment includes oxide containing indium (In) and tin (Sn). The composition of the gate electrode layer 20 is not limited to the above. For example, a different gate electrode layer 20 can be made of an oxide conductor material such as indium oxide ($In_2O_3$), antimony doped tin oxide (Sb—$SnO_2$), zinc oxide (ZnO), aluminum doped zinc oxide (Al—ZnO), gallium doped zinc oxide (Ga—ZnO), ruthenium oxide ($RuO_2$), iridium oxide ($IrO_2$), tin oxide ($SnO_2$), tin monoxide SnO, or niobium doped titanium dioxide (Nb—$TiO_2$). In a thin film transistor according to a different aspect of the present invention, the gate electrode layer 20 can be made of amorphous conductive oxide such as indium gallium zinc complex oxide (IGZO), gallium doped indium oxide (In—Ga—O (IGO)), or indium doped zinc oxide (In—Zn—O (IZO)). In a thin film transistor according to a different aspect of the present invention, the gate electrode layer 20 can be made of strontium titanate ($SrTiO_3$), niobium doped strontium titanate (Nb—$SrTiO_3$), strontium barium complex oxide ($SrBaO_2$), strontium calcium complex oxide ($SrCaO_2$), strontium ruthenate ($SrRuO_3$), lanthanum nickel oxide ($LaNiO_3$), lanthanum titanium oxide ($LaTiO_3$), lanthanum copper oxide ($LaCuO_3$), neodymium nickel oxide ($NdNiO_3$), yttrium nickel oxide ($YNi)_3$), lanthanum calcium manganese complex oxide (LCMO), barium plumbate ($BaPbO_3$), LSCO ($La_xSr_{1-x}CuO_3$), LSMO ($La_{1-x}Sr_xMnO_3$), YBCO ($YBa_2Cu_3O_{7-x}$), LNTO ($La(Ni_{1-x}Ti_x)O_3$), LSTO (($La_{1-x}Sr_x)TiO_3$), STRO ($Sr(Ti_{1-x}Ru_x)O_3$), any other perovskite conductive oxide, or any other pyrochlore conductive oxide.

The solvent of the gate electrode precursor solution is preferably any one of the following solvents (1) to (3) in order to appropriately exert the effects of the present embodiment.

(1) a mixed solvent of two alcohols selected from the group consisting of ethanol, propanol, butanol, 2-methoxyethanol, 2-ethoxyethanol, and 2-butoxyethanol (2) a solvent of one alcohol selected from the group consisting of ethanol, propanol, butanol, 2-methoxyethanol, 2-ethoxyethanol, and 2-butoxyethanol (3) a solvent of one or two carboxylic acids selected from the group consisting of acetic acid, propionic acid, and octylic acid These preferred examples of the solvent of the gate electrode precursor solution are applicable not only to the gate electrode precursor solution but also to any functional solid material precursor solution as a start material for a different functional solid material precursor layer to be described later. Duplicate disclosure will not be provided repeatedly.

(2) Formation of Gate Insulating Layer

As shown in FIG. 2F, similarly to the method of forming the gate electrode precursor layer 20a, a gate insulating layer precursor layer 30a obtained from a precursor solution as a start material containing a precursor containing silicon (Si) as a solute is subsequently formed on the substrate 10 and the patterned gate electrode layer 20. The controller 760 then causes the preliminary baking portion 718 to heat to preliminarily bake the gate insulating layer precursor layer 30a in the atmosphere for about five minutes so as to reach 150° C. A preliminary baking temperature is preferably in the range from 80° C. to 250° C. After the preliminary baking, the gate insulating layer precursor layer 30a is heated to be mainly baked in the oxygen atmosphere for about 20 minutes so as to reach 550° C. There is thus formed a gate insulating layer 30 shown in FIG. 2G.

The gate insulating layer 30 according to the present embodiment is about 170 nm thick.

In a different possible aspect of the present embodiment, in order to pattern the gate insulating layer, similarly to the patterning of the gate electrode, the imprinting is performed using a mold (not shown) exclusive for the gate insulating layer after the gate insulating layer precursor layer 30a is preliminarily baked. In other words, in a different possible aspect, there is further included, prior to the formation of the gate insulating layer 30, the step of imprinting the gate insulating layer precursor layer 30a obtained from the gate insulating layer precursor solution as the start material in the state where the first heater 714 and the second heater 724 are heated in the oxygen atmosphere or in the atmosphere (hereinafter, also collectively referred to as the atmosphere containing oxygen) as in the method of forming the gate electrode layer 20. Furthermore, the respective conditions such as the preferred heating temperature range and pressure similar to those of the patterning of the gate electrode are applicable to the imprinting for forming the gate insulating layer.

(3) Formation of Channel

Similarly to the method of forming the gate electrode precursor layer 20a, a channel precursor layer obtained from a channel precursor solution as a start material containing a precursor containing indium (In) and a precursor containing zinc (Zn) as solutes is thereafter formed on the gate insulating layer 30. Similarly to the method of forming the gate electrode, the preliminary baking and the main baking are then performed as in the first embodiment. There is thus formed, on the gate insulating layer 30, a channel oxide layer 40 (possibly containing inevitable impurities: this applies hereinafter) containing indium (In) and zinc (Zn). The channel oxide layer 40 according to the present embodiment is about 20 nm thick.

In a different possible aspect of the present embodiment, in order to pattern the channel, similarly to the patterning of the gate electrode, the imprinting is performed using a mold (not shown) exclusive for the channel after the channel precursor layer is preliminarily baked. In other words, in a different possible aspect, there is further included, prior to the formation of the channel oxide, the step of imprinting the channel precursor layer obtained from the channel precursor solution as the start material in the state where the first heater 714 and the second heater 724 are heated in the atmosphere containing oxygen as in the method of forming the gate electrode layer 20. Furthermore, the respective conditions such as the preferred heating temperature range and pressure similar to those of the patterning of the gate electrode are applicable to the imprinting for forming the channel.

(4) Formation of Source Electrode and Drain Electrode

In the present embodiment, the imprinting is thereafter performed in accordance with the solution technique, so as to form a source electrode 54 and a drain electrode 52 (each possibly containing inevitable impurities; this applies hereinafter) of an oxide layer containing lanthanum (La) and nickel (Ni). The oxide layer containing lanthanum (La) and nickel (Ni) is also called an LNO layer. Details thereof are described below.

Initially formed on the channel oxide layer 40 in accordance with the known spin coating technique is a source/drain electrode precursor layer 50*a* obtained from a source/drain electrode precursor solution as a start material containing a precursor containing lanthanum (La) (e.g. lanthanum isopropoxide) and a precursor containing nickel (Ni) (e.g. nickel acetate) as solutes (hereinafter, this applies to a solution of a source/drain electrode precursor).

The source/drain electrode precursor layer 50*a* is then heated to be preliminarily baked in the atmosphere for about one minute so as to reach 120° C. As shown in FIG. 2J, the imprinting is thereafter performed using a source/drain electrode mold M2 with the pressure of 8 MPa so as to pattern the source/drain electrode.

Similarly to the step of imprinting the gate electrode precursor layer 20*a*, the source/drain electrode precursor layer 50*a* is imprinted in the state where the first heater 714 (close to the base 712) and the second heater 724 (close to the mold) are heated. In this example, the highest temperature of the first heater 714 is 150° C. whereas the highest temperature of the second heater 724 is 180° C.

The source/drain electrode precursor layer 50*a* of about 100 to 300 nm thick is thus formed in the region where the source electrode and the drain electrode are to be provided ((a) in FIG. 2K). The source/drain electrode precursor layer 50*a* of about 10 to 100 nm thick is formed in the region where the channel oxide layer 40 is to remain ((b) in FIG. 2K). The source/drain electrode precursor layer 50*a* of about 10 to 100 nm thick is formed in the region where the channel oxide layer 40 is to be removed ((c) in FIG. 2K). At least part of the effects of the present embodiment can be exerted when the imprinting is performed using the source/drain electrode mold M2 with a pressure in the range from 1 MPa to 20 MPa.

The source/drain electrode precursor layer 50*a* is then heated to be mainly baked in the atmosphere for about five minutes so as to reach the range from 550° C. to 650° C. There is thus formed a source/drain electrode oxide layer 50.

The source/drain electrode oxide layer 50 is then entirely dry etched by argon (Ar) plasma. The source/drain electrode oxide layer 50 in the thinnest region ((c) in FIG. 2K) is etched initially, and the channel oxide layer 40 thus exposed is etched subsequently. The source/drain electrode oxide layer 50 in the second thinnest region ((b) in FIG. 2K) is then etched completely. When the channel oxide layer 40 in the thinnest region ((c) in FIG. 2K) is etched completely, the plasma process is stopped. In this manner, the thickness of the layer in each of the regions (b) and (c) is adjusted in the present embodiment. The channel oxide layer 40 in the region (c) is thus removed whereas the channel oxide layer 40 in the region (b) remains. As shown in FIG. 2L, the channel region itself can be separated and the source electrode 54 and the drain electrode 52 are completely separated from each other by the channel region.

In the present embodiment, heating is further performed in the nitrogen atmosphere for about 15 minutes so as to reach 500° C., and the thin film transistor 100 according to the present embodiment is produced. This heat treatment causes loss of oxygen in ITO and this loss leads to oxygen loss carriers having conductivity, so as to improve conductivity. The imprinting step according to the present embodiment enables separation of the channel region of the submicron order (more particularly, about 500 nm). The source electrode 54 and the drain electrode 52 according to the present embodiment each have resistivity of the order of $10^{-3}$ Ωcm or less.

The etching step according to the present embodiment is executed in accordance with the dry etching technique using argon (Ar) plasma. The etching step can be alternatively executed in accordance with the wet etching technique without including the vacuum process.

According to the researches and analyses of the inventors, in order to form, by the imprinting, a functional solid material layer that has a significantly certain and/or accurate imprinted structure, the first temperature of the heat source is preferably in the range from 100° C. to 200° C. and the second temperature of each of the functional solid material precursor layers is preferably in the range from 90° C. to 190° C. in the above embodiment. The first temperature of the heat source is more preferably in the range from 160° C. to 180° C. and the second temperature of each of the functional solid material precursor layers is more preferably in the range from 150° C. to 170° C. In these temperature ranges, each of the functional solid material precursor layers has higher plastic deformability and the main solvent can be removed sufficiently.

The first temperature and the second temperature are preferably different from each other by at least 10° C. If the difference is less than 10° C., heat is unlikely to be supplied or transferred from the heat source to the functional solid material precursor layer. If the temperature of the mold is preliminarily made higher than the temperature of the base by at least 10° C. or if the controller 760 controls so as to cause such a difference in temperature as in the present embodiment, heat is likely to be supplied or transferred from the heat source to each of the functional solid material precursor layers more certainly and more positively. This contributes to formation of the imprinted structure significantly certainly and/or accurately. Although its mechanism is not clarified at the present stage, in order to form a functional solid material layer that has such a significantly certain and/or accurate imprinted structure, the temperature of the mold is preferably set or controlled to be higher than the temperature of the base upon imprinting.

The preferred temperature of the mold is set in the range from 90° C. to 300° C. for the following reasons. Firstly, if the temperature is less than 90° C., plastic deformability of each of the precursor layers is deteriorated due to decrease in temperature of the precursor layer. Moreover, if the temperature exceeds 300° C., each of the precursor layers is solidified excessively to deteriorate the plastic deformability of the precursor layer. In view of these, the imprinting is more preferably performed in the imprinting step using a mold heated to reach a temperature in the range from 100° C. to 250° C.

In a preferred aspect, after the imprinting step, the functional solid material precursor layer is heat treated at the main baking temperature (third temperature) higher than the first temperature of the heat source (more particularly the highest temperature of the heat source) in the atmosphere containing oxygen as in the present embodiment so that the functional solid material precursor layer is transformed into the functional solid material layer. The main baking is performed at the third temperature higher than the first temperature to promote solidification. If the functional solid material layer is made of a crystalline material in this case, crystallization is promoted to exert sufficient functionality.

As described above, the present embodiment includes the "imprinting step" of imprinting at least part of an oxide layer to form an imprinted structure. By including the imprinting step, there is no need to include a process requiring relatively long time and/or expensive equipment, such as the vacuum process, a process in accordance with the photolithography technique, or the ultraviolet irradiation process. The present embodiment is significant in that all the layers including the gate electrode, the gate insulating film, the channel, the source electrode, and the drain electrode configuring the device are formed in accordance with the solution technique. The thin film transistor 100 according to the present embodiment is thus quite excellent from the industrial and mass productivity perspectives.

The source/drain electrode oxide layer 50 according to the present embodiment includes oxide containing lanthanum (La) and nickel (Ni). The source/drain electrode oxide layer 50 is not limited to this composition. For example, it is possible to use an oxide conductor material such as indium tin oxide (ITO), indium oxide ($In_2O_3$), antimony doped tin oxide (Sb—$SnO_2$), zinc oxide (ZnO), aluminum doped zinc oxide (Al—ZnO), gallium doped zinc oxide (Ga—ZnO), ruthenium oxide ($RuO_2$), iridium oxide ($IrO_2$), tin oxide ($SnO_2$), tin monoxide SnO, or niobium doped titanium dioxide (Nb—$TiO_2$). In a thin film transistor according to a different aspect of the present invention, the source/drain electrode oxide layer 50 can be made of amorphous conductive oxide such as indium gallium zinc complex oxide (IGZO), gallium doped indium oxide (In—Ga—O (IGO)), or indium doped zinc oxide (In—Zn—O (IZO)). In a thin film transistor according to a different aspect of the present invention, the source/drain electrode oxide layer 50 can be made of strontium titanate ($SrTiO_3$), niobium doped strontium titanate (Nb—$SrTiO_3$), strontium barium complex oxide ($SrBaO_2$), strontium calcium complex oxide (Sr—$CaO_2$), strontium ruthenate ($SrRuO_3$), lanthanum nickel oxide ($LaNiO_3$), lanthanum titanium oxide ($LaTiO_3$), lanthanum copper oxide ($LaCuO_3$), neodymium nickel oxide ($NdNiO_3$), yttrium nickel oxide ($YNiO_3$), lanthanum calcium manganese complex oxide (LCMO), barium plumbate ($BaPbO_3$), LSCO ($La_xSr_{1-x}CuO_3$), LSMO ($La_{1-x}Sr_xMnO_3$), YBCO ($YBa_2Cu_3O_{7-x}$), LNTO ($La(Ni_{1-x}Ti_x)O_3$), LSTO (($La_{1-x}Sr_x$)$TiO_3$), STRO ($Sr(Ti_{1-x}Ru_x)O_3$), any other perovskite conductive oxide, or any other pyrochlore conductive oxide.

The "functional solid material precursor solution" according to the present embodiment preferably includes at least one selected from the group consisting of a solution containing metal alkoxide (hereinafter, also referred to as a "solution containing metal alkoxide as a solute"; this applies to other functional solid material precursor solutions), a solution containing a metal organic acid salt, a solution containing a metal inorganic acid salt, a solution containing metal halide, a solution containing an inorganic compound containing metal, nitrogen, and hydrogen, a solution containing metal hydride, a solution containing metal nanoparticles, and particulate ceramics.

The substrate 10 according to the present embodiment is the $SiO_2$/Si substrate. The material for the substrate 10 is, however, not limited to the above. For example, it is possible to use an insulating substrate (such as a quartz glass ($SiO_2$) substrate, an insulating substrate obtained by forming an STO ($SrTiO_3$) layer on a surface of an Si substrate with an $SiO_2$ layer and a Ti layer being interposed therebetween, an alumina ($Al_2O_3$) substrate, an SRO ($SrRuO_3$) substrate, or an STO ($SrTiO_3$) substrate) or a solid substrate such as a semiconductor substrate (a silicon (Si) substrate, a silicon carbide (SiC) substrate, or the like).

Upon patterning the source electrode 54 and the drain electrode 52 in the imprinting step, the source/drain electrode oxide layer 50 is etched entirely after the main baking. The entire etching can be alternatively performed before the main baking. In other words, there is preferably included, between the imprinting step and the functional solid material layer formation step (particularly, the main baking), the step of entirely etching the functional solid material precursor layer (e.g. the gate electrode precursor layer 20a) under the condition where the functional solid material precursor layer is removed in the thinnest region of the imprinted functional solid material precursor layer. It is possible to remove the unnecessary region more easily than etching the functional solid material precursor layer after the main baking.

Modification Example (1) of First Embodiment

Through the many tests and analyses, the inventors have found that there is a preferred example of the imprinting step even with control different from that of the first embodiment and the modification examples in which the first heater 714 and the second heater 724 are used. In the first embodiment, the temperatures are controlled so that the first heater 714 and the second heater 724 are heated simultaneously when or immediately after the mold is pressed against the functional solid material precursor layer. It has been found that temperature control of the first heater 714 and the second heater 724 is not limited to such an example.

More specifically, in a different possible aspect, the controller 760 preliminarily controls so that the temperature (T2) of the second heater 724 is higher than the temperature (T1) of the first heater 714 before the mold is pressed against the functional solid material precursor layer. FIG. 5 is a flowchart of a different example of the imprinting step (typically, the step of imprinting the gate electrode precursor layer 20a) as part of the steps of producing a functional device (the thin film transistor 100 also in the present embodiment). The steps other than the imprinting step are similar to the steps according to the first embodiment, and disclosure thereof will not be provided repeatedly.

Modification Example of the Imprinting Step

As shown in FIG. 5, initially in step S201, the substrate 10 having the gate electrode precursor layer 20a to be processed in the imprinting step is made to adhere to the base 712. Furthermore, the fixing portion 722 retains the gate electrode mold M1 or the like with the quartz glass 726 being interposed therebetween.

In step S202, the controller 760 starts heating the first heater 714 and the second heater 724. The controller 760 heats the first heater 714 and the second heater 724 and starts monitoring the temperatures of the first heater 714 and the second heater 724. The temperatures start to be monitored in step S202 in the present embodiment. In a different possible aspect, the temperatures are monitored constantly.

As in step S203, the controller 760 then compares the temperature (T1) of the first heater 714 and the temperature (T2) of the second heater 724 and adjusts or controls the temperatures of the heaters until the temperature (T2) of the second heater 724 is made higher than the temperature (T1) of the first heater 714. When the temperature (T2) of the second heater 724 is made higher than the temperature (T1) of the first heater 714, as in step S204, the controller 760 shifts downward the upper imprinting portion 720. The controller 760 presses the gate electrode mold M1 against the gate electrode precursor layer 20a with a pressure in the range from 1 MPa to 20 MPa, for example. In the present embodiment, the temperature (T1) of the first heater 714 is 100° C. whereas the temperature (T2) of the second heater 724 is 180° C.

Then, after elapse of a certain time period (e.g. 300 seconds), as in step S205, the controller 760 separates the mold from the functional solid material precursor layer.

Also in this modification example, the imprinting is performed in the state where the temperature (first temperature) of the mold for supplying heat to the functional solid material precursor layer is higher than the temperature (second temperature) of the functional solid material precursor layer heated by the first heater 714 in at least part of the time period while the mold for forming the imprinted structure is pressed against the functional solid material precursor layer. Similarly to the first embodiment, it is thus possible to form the functional solid material layer that has the significantly certain and/or accurate imprinted structure. It is thus possible to produce a functional device that includes a functional solid material layer having such an imprinted structure.

Modification Example (2) of First Embodiment

The first embodiment exemplifies the case where both of the first heater 714 and the second heater 724 are heated. The means for supplying or transferring heat to the functional solid material precursor layer is not limited to that according to this example. In a possible modification example, heat is supplied or transferred to the functional solid material precursor layer while only the first heater 714 is heated. However, in view of the alignment for lamination of the functional solid material layers, heating both of the first heater 714 and the second heater 724 is preferred rather than heating only the first heater 714.

Modification Example (2') of First Embodiment

In a different possible aspect as exemplary variation of the modification example (2) of the first embodiment, the temperatures are controlled so that the temperature (T1) of the first heater 714 is kept constant and only the temperature (T2) of the second heater 724 increases to be higher than the temperature (T1) of the first heater 714.

Specifically, the controller 760 controls so that the temperature (T1) of the first heater 714 reaches a certain level (e.g. 100° C. or 150° C.) before the imprinting is started. The temperature (second temperature) of the functional solid material precursor layer on the substrate 10 is thus stabilized at the temperature of the first heater 714. The controller 760 also heats to increase the temperature (T2) of the second heater 724 separated from the functional solid material precursor layer, or the temperature of the mold, so as to reach 80° C., for example. Immediately after the imprinting is performed, the controller 760 heats the second heater 724 until the temperature (T2) of the second heater 724 eventually reaches 180° C. or the like and then controls so that the second heater is kept at the temperature for a certain time period. The controller 760 then cools the first heater 714 and the second heater 724 and separates the mold from the functional solid material precursor layer.

Also in the imprinting step described above, the functional solid material precursor layer is imprinted in the state where the first temperature of the heat source (the mold in the present embodiment) for supplying heat to the functional solid material precursor layer is higher than the second temperature of the functional solid material precursor layer. Heat can be accordingly supplied or transferred to the functional solid material precursor layer. Similarly to the first embodiment, it is thus possible to form the functional solid material layer that has the significantly certain and/or accurate imprinted structure. It is thus possible to produce a functional device that includes a functional solid material layer having such an imprinted structure.

Modification Example (3) of First Embodiment

In a different possible aspect of the first embodiment, temperature control is performed so that the highest temperature of the first heater 714 is equal to the highest temperature of the second heater 724. As in the first embodiment, also in the case of such temperature control, the temperature (T1) of the first heater 714 increases faster than the temperature (T2) of the second heater 724 in an early stage. There is thus provided a time zone (e.g. a time zone corresponding to Ta in FIG. 4) while the temperature (T1) of the first heater 714 is higher than the temperature (T2) of the second heater 724. Heat is thus substantially supplied or transferred to the functional solid material precursor layer in the imprinting step. This can contribute with fine repeatability to improvement in moldability of the functional solid material precursor layer as well as to molding at a relatively low temperature.

Here is a specific example.

FIG. 6 is a sectional schematic view of a memory transistor 200 according to the present embodiment. The memory transistor 200 according to the present embodiment includes the substrate 10 and a patterned oxide layer (LNO layer) which is formed on the substrate 10, serves as a gate electrode layer 120, and contains lanthanum (La) and nickel (Ni). The LNO layer serving as the gate electrode layer 120 is formed using the material for the source electrode 54 and the drain electrode 52 according to the first embodiment in accordance with a method similar to the method of forming the gate electrode layer 20. Accordingly, duplicate disclosure is not provided repeatedly.

There is then formed, on the gate electrode layer 120, a PZT ($Pb(Zr_xTi_{1-x})O_3$) layer serving as a ferroelectric layer 130. In the present embodiment, the imprinting is performed in accordance with the solution technique, so as to form the ferroelectric layer 130 (possibly containing inevitable impurities; this applies hereinafter) of an oxide layer containing lead (Pb), zirconium (Zr), and titanium (Ti). Details thereof are described below.

Initially formed on the gate electrode layer 120 in accordance with the known spin coating technique is a ferroelectric layer precursor layer obtained from a ferroelectric layer precursor solution as a start material containing a precursor containing lead (Pb), a precursor containing zirconium (Zr), and a precursor containing titanium (Ti) as solutes.

The ferroelectric layer precursor layer is then heated to be preliminarily baked in the atmosphere for about five minutes so as to reach 150° C. The imprinting is performed thereafter using a ferroelectric layer mold (not shown) with the pressure of 8 MPa in order to pattern the ferroelectric layer.

In the step of imprinting the ferroelectric layer precursor layer, the controller 760 heats the first heater 714 (close to the base 712) and the second heater 724 (close to the mold) so that both of the highest temperature of the first heater 714 and the highest temperature of the second heater 724 reach 180° C. In this imprinting step, the temperature (T1) of the first heater 714 increases faster than the temperature (T2) of the second heater 724 in an early stage. There is thus provided a time zone (part of the time period) while the temperature (T1) of the first heater 714 is higher than the temperature (T2) of the second heater 724. In the present embodiment, the ratio of the "part of the time period" is about 80% to the time period while the mold is pressed against the ferroelectric layer precursor layer as the functional solid material precursor layer.

The first heater 714 is then heated for the main baking so as to reach 650° C., similarly to the case of mainly baking the gate electrode precursor layer 20a in the first embodiment. There is thus formed a PZT (Pb(Zr$_x$Ti$_{1-x}$)O$_3$) layer.

A channel oxide layer 40 is then formed on the ferroelectric layer 130 in accordance with a method similar to the method of forming the channel oxide layer 40 in the first embodiment. An ITO layer is thereafter formed using the material for the gate electrode layer 20 in the first embodiment in accordance with a method similar to the method of forming the LNO layer for the source electrode 54 and the drain electrode 52. Accordingly, duplicate disclosure is not provided repeatedly.

As described above, also in the case where the highest temperature of the first heater 714 is equal to the highest temperature of the second heater 724, heat is substantially supplied or transferred to the functional solid material precursor layer in the imprinting step. It is thus possible to form the functional solid material layer that has the significantly certain and/or accurate imprinted structure.

In the memory transistor according to the present embodiment, it is possible to use, as the ferroelectric material, in place of PZT (Pb (Zr$_x$Ti$_{1-x}$)O$_3$), Nb doped PZT, La doped PZT, barium titanate (BaTiO$_3$), lead titanate (PbTiO$_3$), BTO (Bi$_4$Ti$_3$O$_{12}$), BLT (Bi$_{4-x}$La$_x$Ti$_3$O$_{12}$), SBT (SrBi$_2$Ta$_2$O$_9$), BZN (Bi$_{1.5}$Zn$_{1.0}$Nb$_{1.5}$O$_7$), or bismuth ferrite (BiFeO$_3$).

Unlike the present embodiment, even in a case where the highest temperature of the first heater 714 and the highest temperature of the second heater 724 are equal to each other and increase in the similar manners, it is possible to provide a time zone while the temperature (second temperature) of the functional solid material precursor layer is substantially lower than the temperature (first temperature) of the mold or the base. For example, a component of low thermal conductivity (e.g. a resin plate) is provided only between the first heater 714 and the substrate 10 so that the temperature of the mold increases faster than the temperature of the substrate 10. In this case, it is possible to provide a time zone while the temperature of the mold is higher than the temperature of the functional solid material precursor layer. Heat is thus supplied or transferred to the functional solid material precursor layer even in such a case. This can contribute with fine repeatability to improvement in moldability of the functional solid material precursor layer as well as to molding at a relatively low temperature. In other words, in a preferred aspect, the temperature of the mold and/or the temperature of the substrate 10 is increased in the imprinting step, so that heat is more possibly supplied or transferred to the functional solid material precursor layer as described above.

Modification Example (4) of First Embodiment

The apparatus 700 for producing a functional device according to the first embodiment includes the first heater 714 for heating the base 712 that allows the substrate 10 having the functional solid material precursor layer to be mounted thereon and the second heater 724 for heating the mold used for the imprinting as the heat source for supplying heat to the functional solid material precursor layer. The heaters of the first embodiment are not limited to the above. Other examples of the "heat source" for supplying heat to the functional solid material precursor layer include known means utilizing radiation heat and known means utilizing microwaves. These means can be controlled by the controller 760 similarly to the control in the first embodiment.

Modification Example (5) of First Embodiment

In a different possible preferred aspect, the preliminary baking temperature in the preliminary baking step of forming a functional solid material precursor layer is made lower than the boiling point of the solvent of the functional solid material precursor solution and the temperature (first temperature) of the "heat source" in the subsequent main baking is made higher than the boiling point of the solvent. For example, control can be performed so that the preliminary baking temperature in the preliminary baking step is made lower than the boiling point of the solvent of the functional solid material precursor solution by 10° C. to 30° C. By this temperature control, the imprinting is performed in a state where the solvent is relatively likely to remain in the functional solid material precursor layer. The functional solid material precursor layer thus includes no or very little solvent, so as to prevent the functional solid material precursor layer from being hardened and disturbing the imprinting. It is thus possible to form the imprinted structure more easily.

The respective aspects of the heat source and the heat suppliers and the preferred temperature ranges in the first embodiment and the modification examples (1) to (4) are applicable to the following embodiments. Accordingly, duplicate disclosure is not provided repeatedly.

Modification Example (6) of First Embodiment

In a preferred example of the imprinting step according to each of the first embodiment and the modification examples, the mold separation process is preliminarily performed on the surface of each of the precursor layers to be in contact with an imprinting surface and/or on the imprinting surface of the mold, and each of the precursor layers are imprinted thereafter. Such a process achieves decrease in frictional force between each of the precursor layers and the mold, so that each of the precursor layers can be imprinted more accurately. Examples of a mold separation agent usable in the mold separation process include surface active agents (e.g. a fluorochemical surface active agent, a silicone surface active agent, and a non-ionic surface active agent), and diamond-like carbon containing fluorine. The mold separation process is applicable to the following embodiments. Accordingly, duplicate disclosure is not provided repeatedly.

Modification Example (7) of First Embodiment

In a different possible aspect of the imprinting step according to each of the first embodiment and the modification examples, if the "functional solid material precursor solution" includes at least one selected from the group consisting of a solution containing metal alkoxide, a solution containing a metal organic acid salt, and a solution containing a metal inorganic acid salt, in the imprinting step, the functional solid material precursor layer is transformed into the functional solid material layer at a volume shrinkage factor in the range from 20% to 80%. Each of the solutions listed above is selected preferably in order to improve size accuracy of the imprinted structure.

Furthermore, particularly when the "functional solid material precursor solution" includes at least one selected from the group consisting of a solution containing metal halide, a solution containing an inorganic compound containing metal, nitrogen, and hydrogen, a solution containing metal hydride, a solution containing metal nanoparticles, and particulate ceramics, in the functional solid material layer formation step, the functional solid material precursor layer is transformed into the functional solid material layer at a volume shrinkage factor in the range from 1% to 30%. Each of the solutions listed above is selected preferably in order to facilitate size control before and after the main baking.

According to the researches and analyses of the inventors, if the imprinting step is executed using a complex solution obtained by mixing a solution containing metal alkoxide and a solution containing a metal organic acid salt as the functional solid material precursor solution, it has been found that the functional solid material precursor layer is transformed into the functional solid material layer at a smaller volume shrinkage factor. The inventors have found that use of the complex solution is one of effective means for achieving the technical objects that are hard to be realized simultaneously, namely, facilitation of plastic deformation in the imprinting step and facilitation of size control before and after the main baking.

Described below is a specific example in which the following solutions (1) and (2) are used. The solvent of each of the solutions is 2-methoxyethanol.
(1) Lanthanum isopropoxide is selected as metal alkoxide and nickel acetate is selected as a metal organic acid salt.
(2) Lanthanum acetate is selected as a metal organic acid salt and nickel acetate is selected as a metal organic acid salt.

The functional solid material precursor layer is formed by the preliminary baking at 130° C. using the solution (1) from the above solutions and the imprinting is then performed in the state where the first heater 714 (close to the base 712) and the second heater 724 (close to the mold) are heated as in the step of imprinting the gate electrode precursor layer 20*a*. In this example, the highest temperature of the first heater 714 is 160° C. whereas the highest temperature of the second heater 724 is 180° C. (the initial temperatures are 80° C.). The mold is pressed with the pressure of 8 MPa for five minutes. The functional solid material precursor layer thus patterned is thereafter heat treated at 450° C. so as to be mainly baked by the first heater 714 in the atmosphere.

Calculated were the volume shrinkage factors before and after the main baking, in other words, the volume shrinkage factors upon transforming the functional solid material precursor layer into the functional solid material layer. The volume shrinkage factor in the example using the solution (1) was 24% whereas the volume shrinkage factor in the example using the solution (2) was 73%.

FIG. 7 shows measurement results, using an atomic force microscope (AFM), of the patterned functional solid material precursor layer and the functional solid material layer after the main baking according to the example using the solution (1). As shown in FIG. 6, the pattern of the functional solid material layer after the main baking was not largely shrunk in width and height, as compared with the pattern of the functional solid material precursor layer before the main baking.

FIG. 8 shows measurement results, using the AFM, according to a different specific example in which only combination in the complex solution and the preliminary baking temperature are changed in the modification example (6) of the first embodiment. Specifically, metal alkoxide serving as a solute was zirconium butoxide. The solvent was 2-methoxyethanol. The metal organic acid salt serving as a solute was zirconium 2-ethylhexanoate. The solvent was propionic acid. The preliminary baking temperature was 150° C.

As shown in FIG. 8, in the imprinting step in this example, the functional solid material precursor layer was transformed into the functional solid material layer at the volume shrinkage factor of 54%.

Described below is assumption of the inventors on the major mechanism in which the volume shrinkage factors differ depending on the materials as described above. FIGS. 9(*a*) to 9(*c*) are assumption views each showing a typical gel state and final oxide in order to indicate a reaction process mechanism depending on the difference in material for the precursor.

As shown in FIG. 9(*a*), in the case of using the precursor layer obtained from the precursor solution of metal alkoxide as the start material, it is assumed that the following reaction processes proceed before generation of oxide. Metal alkoxide is initially hydrolyzed, so that an alkyl group is partially substituted by a hydroxyl group and alcohol is generated. Dehydration then occurs, and polycondensation reaction occurs partially to form a network of M (metal)-O (oxygen)-M (metal). Thereafter, the reactant is changed into oxide while carbon dioxide and water are generated by thermal decomposition reaction. The oxide layer thus formed tends to be denser. As shown in FIG. 9(*b*), in the case of using the precursor layer obtained from the precursor solution of a metal organic acid salt as the start material, it is assumed that the precursor is rapidly changed into oxide while generating carbon dioxide and water by direct thermal decomposition. The oxide layer thus formed tends to be sparser, in other words, porous.

The precursor layer obtained from the complex solution as the start material containing the precursor solution of metal alkoxide and the precursor solution of a metal organic acid salt has both the physical properties shown in FIGS. 9(*a*) and 9(*b*). As shown in FIG. 9(*c*), the oxide layer eventually formed is assumed to have moderate (neither dense nor sparse) physical properties. It will be possible to obtain excellent properties that the imprinting step can be performed in a state where the imprinted structure is formed relatively easily and the volume shrinkage factor is small after the main baking. As described above, use of the complex solution is assumed to be one of effective means for achieving the technical objects that are hard to be realized simultaneously, namely, facilitation of plastic deformation in the imprinting step and facilitation of size control before and after the main baking.

As described above, although there are differences due to materials, it has been found that the functional solid material precursor layer is transformed into the functional solid material layer in the imprinting step at a volume shrinkage factor in the range from 20% to 80%. Use of the complex solution containing the solution containing metal alkoxide and the solution containing a metal organic acid salt limits the volume shrinkage factor into the range from 20% to 55%. It is thus a more preferred aspect from the perspectives of facilitation of size control on the imprinted structure and stabilization of size accuracy.

Modification Example (8) of First Embodiment

FIG. 10 is a view of a configuration of an apparatus 800 for producing a functional device according to the present embodiment. Described in the present embodiment is an example of the imprinting step using the apparatus 800 for producing a functional device according to a modification example of the apparatus 700 for producing a functional device according to the first embodiment.

Configuration of Apparatus 800 for Producing Functional Device

As shown in FIG. 10, the apparatus 800 for producing a functional device according to the present embodiment is roughly divided into three constituent parts, and includes a fixed upper imprinting portion, a horizontally shiftable lower imprinting portion that retains a mold and allows the substrate 10 to be mounted thereon, and a controller 860 therefor.

Specifically, the upper imprinting portion includes a roller 822 for pressing a mold (e.g. the mold M1) while rotating, a roller retainer 823 for retaining the roller 822, and a roller heater 824 accommodated in the roller 822, for heating the roller 822. The mold according to the present embodiment is made of nickel (Ni). The roller heater 824 serves as a heat source for supplying heat to a functional solid material precursor layer (e.g. the gate electrode precursor layer 20a shown in FIG. 10) upon the imprinting. The upper imprinting portion includes a known rotary mechanism for rotating the roller 822, a known lift mechanism for shifting upward and downward the roller 822 (both not shown), and a pressure sensor (not shown) for monitoring press force (conceptually indicated by a downward arrow in FIG. 10) of the roller 822 toward the gate electrode mold M1 or the like for the functional solid material precursor layer during the imprinting step.

At the lower imprinting portion, there is mounted, on a base 812, the substrate 10 having the functional solid material precursor layer to be processed (e.g. the gate electrode precursor layer 20a). The substrate 10 is sucked from a suction portion 816 by a pump (not shown) so as to adhere to the base 812. Furthermore, the base 712 according to the present embodiment is connected with another heat source for supplying heat to the functional solid material precursor layer upon imprinting, namely, a base heater 814 for heating the substrate 10 and the functional solid material precursor layer. The lower imprinting portion according to the present embodiment further includes a shifting seat 818 that supports the base 812 and the base heater 814 and horizontally shifts on an apparatus seat 811. The shifting seat 818 includes a mold retaining stage 825 having a mold retainer 819 that retains a mold and a lift 817 that lifts upward the substrate 10 using a known lift mechanism so as to separate the substrate 10 from the base. The mold retaining stage 825 also shifts along with the shifting seat 818 that horizontally shifts on the apparatus seat 811.

The apparatus 800 for producing a functional device according to the present embodiment further includes the controller 860 and a computer 862 connected to the controller 860. The controller 860 performs various control upon imprinting, inclusive of controlling rotation and vertical shift of the roller 822 using the upper imprinting portion by known feedback control, controlling press force of the roller 822 toward the mold, controlling horizontal shift of the shifting seat 818, controlling the temperature of the roller heater 824, and controlling the temperature of the base heater 814. The controller 860 and the computer 862 according to the present embodiment monitor or totally control the processes of the constituent parts in accordance with a functional device production program for execution of a series of processes in the present embodiment using the respective constituent parts, similarly to the apparatus 700 for producing a functional device according to the first embodiment.

The base heater 814 in the present embodiment also serves as a preliminary baking heater for preliminarily baking (also called the "drying step") a functional solid material precursor layer. In the present embodiment, the lower imprinting portion including the preliminary baking heater thus serves as a preliminary baking portion of the apparatus 800 for producing a functional device. In a different possible aspect, the preliminary baking heater is provided separately from the base heater 814. In a different possible aspect, the base heater 814 also serves as a heater for the main baking to be performed after the imprinting step.

When the imprinting step is executed using the apparatus 800 for producing a functional device according to the present embodiment, as described above, the roller 822 directly presses the mold with press force in the range from 1 MPa to 20 MPa or the like so as to imprint the functional solid material precursor layer. In this case, the roller heater 824 and/or the base heater 814, temperature of which is controlled by the controller 860, supplies heat to the functional solid material precursor layer. The shifting seat 818 horizontally shifts relatively to the roller retainer 823 in association with rotational speed of the roller 822. The shifting seat 818 according to the present embodiment horizontally shifts relatively to the roller retainer 823 at the speed of 0.05 mm/s, for example.

Also when the roller 822 serves as a heat source for supplying heat to the functional solid material precursor layer so as to supply heat at the first temperature in association with the temperature of the base heater 814, as described above, heat can be substantially supplied or shifted to the functional solid material precursor layer during the imprinting step. It is thus possible to form the functional solid material layer that has the significantly certain and/or accurate imprinted structure.

Second Embodiment

FIGS. 11(a) to 13(c) are explanatory views of a piezoelectric ink jet head 300 according to the present embodiment. FIG. 11(a) is a sectional view of the piezoelectric ink jet head 300. FIGS. 11(b) and 11(c) each show a state where the piezoelectric ink jet head 300 discharges ink. In the method of producing the piezoelectric ink jet head 300, the imprinting step is executed using the apparatus 700 for producing a functional device according to the first embodiment. Accordingly, the disclosure duplicate with that of the first embodiment is not provided repeatedly.

Configuration of Piezoelectric Ink Jet Head 300

As shown in FIG. 11(a), the piezoelectric ink jet head 300 according to the present embodiment includes a cavity component 340, a vibration plate 350 that is attached to one side of the cavity component 340 and is provided with a piezoelectric element 320, a nozzle plate 330 that is attached to the other side of the cavity component 340 and is provided with a nozzle opening 332, and an ink chamber 360 that is defined by the cavity component 340, the vibration plate 350, and the nozzle plate 330. The vibration plate 350 is provided with an ink supply port 352 that is in communication with the ink chamber 360 and is used for supplying ink into the ink chamber 360.

In the piezoelectric ink jet head 300 according to the present embodiment, as shown in FIGS. 11(b) and 11(c), an appropriate voltage is initially applied to the piezoelectric element 320, so that the vibration plate 350 is temporarily bent upward and ink is supplied from a reservoir (not shown) into the ink chamber 360. The vibration plate 350 is then bent downward, so that dripped ink i is discharged from the ink chamber 360 through the nozzle opening 332. Accordingly, clear printing can be realized on a printing target.

Method of Producing Piezoelectric Ink Jet Head 300 According to the Present Embodiment In the piezoelectric ink jet head 300 configured as described above, at least part of the piezoelectric element 320 (a first electrode layer 322, a piezoelectric layer 324, and a second electrode layer 326) and the cavity component 340 are formed in accordance with the method of producing a functional device according to the present embodiment. Described step by step below is the method of producing the piezoelectric ink jet head 300 according to the present embodiment.

FIGS. 12(a) to 14(e) are explanatory views of the method of producing the piezoelectric inkjet head according to the present embodiment. FIGS. 12(a) to 12(f), FIGS. 13(a) to 13(d), and FIGS. 14(a) to 14(e) show the respective processes.

(1) Formation of Piezoelectric Element 320
(1-1) Formation of First Electrode Layer 322

Initially formed on a dummy substrate 310 in accordance with the known spin coating technique is a functional solid material (LNO) precursor layer 322' (hereinafter, also simply referred to as the "precursor layer 322'") which is obtained from a functional solid material precursor solution as a start material containing a precursor containing lanthanum (La) (e.g. lanthanum isopropoxide) and a precursor containing nickel (Ni) (e.g. nickel acetate) as solutes.

The precursor layer 322' is then heated to be preliminarily baked in the atmosphere for about one minute so as to reach 120° C. The precursor layer 322' thus preliminarily baked is about 300 nm thick in the present embodiment.

As shown in FIG. 12(b), the precursor layer 322' is then imprinted with the pressure of 8 MPa using a mold M3 (having the difference in height of 300 nm) which is concave in the region corresponding to the first electrode layer 322 forming part of the piezoelectric element 320, in order to pattern the functional solid material layer.

Similarly to the step of imprinting the ferroelectric layer precursor layer in the modification example (3) of the first embodiment, the precursor layer 322' is imprinted in the state where the first heater 714 (close to the base 712) and the second heater 724 (close to the mold) are heated. In this example, the highest temperature of the first heater 714 is 180° C. whereas the highest temperature of the second heater 724 is 180° C. The precursor layer 322' having the imprinted structure is formed through the imprinting step according to the present embodiment. In this imprinted structure, a convex portion is 300 nm thick whereas a concave portion is 50 nm thick, for example.

The precursor layer 322' is thereafter entirely etched so that the precursor layer 322' is removed in the regions other than a region corresponding to the first electrode layer 322 (the entire etching step). The entire etching step is executed in accordance with the wet etching technique without adopting the vacuum process.

The precursor layer 322' is then heat treated to be mainly baked for 10 minutes at 550° C. using the RTA device. As shown in FIG. 12(c), the first electrode layer 322 (possibly containing inevitable impurities; this applies to other oxide layers formed in accordance with the solution technique) is formed as the oxide layer containing lanthanum (La) and nickel (Ni).

(1-2) Formation of Piezoelectric Layer 324

As shown in FIG. 12(d), subsequently formed on the dummy substrate 310 and the first electrode layer 322 in accordance with the known spin coating technique is a functional solid material (PZT) precursor layer 324' (hereinafter, also simply referred to as the "precursor layer 324'") which is obtained from a precursor solution as a start material containing metal alkoxide as a solute (PZT sol-gel solution manufactured by Mitsubishi Materials Corporation).

The precursor layer 324' is then heated to be preliminarily baked in the atmosphere for about five minutes so as to reach 150° C. The precursor layer 324' thus preliminarily baked is about 1 μm to 10 μm thick in the present embodiment.

As shown in FIG. 12(e), the precursor layer 324' is subsequently imprinted with the pressure of 8 MPa using a mold M4 (having the difference in height of 500 nm) which is concave in the region corresponding to the piezoelectric layer 324 forming part of the piezoelectric element 320, in order to pattern the functional solid material layer.

Similarly to the step of imprinting the ferroelectric layer precursor layer according to the modification example (3) of the first embodiment, the precursor layer 324' is imprinted in the state where the first heater 714 (close to the base 712) and the second heater 724 (close to the mold) are heated. In this example, the highest temperature of the first heater 714 is 180° C. whereas the highest temperature of the second heater 724 is 180° C. The precursor layer 324' having the imprinted structure is formed through the imprinting step according to the present embodiment. In this imprinted structure, a convex portion is 1 μm to 10 μm thick whereas a concave portion is 50 nm thick, for example.

The precursor layer 324' is then entirely etched so that the precursor layer 322' is removed in the regions other than a region corresponding to the piezoelectric layer 324 (the entire etching step). The entire etching step is executed in accordance with the wet etching technique without adopting the vacuum process.

The precursor layer 324' is thereafter heat treated to be mainly baked for 10 minutes at 650° C. using the RTA device. As shown in FIG. 12(f), there is thus formed the piezoelectric layer 324 including the functional solid material layer (PZT).

(1-3) Formation of Second Electrode Layer 326

Initially formed on the dummy substrate 310 and the piezoelectric layer 324 in accordance with the known spin coating technique is a functional solid material (LNO) precursor layer 326' (hereinafter, also simply referred to as the "precursor layer 326'") which is obtained from a functional solid material precursor solution as a start material containing a precursor containing lanthanum (La) (e.g. lanthanum isopropoxide) and a precursor containing nickel (Ni) (e.g. nickel acetate) as solutes.

The precursor layer 326' is then heated to be preliminarily baked in the atmosphere for about one minute so as to reach 120° C. The precursor layer 326' thus preliminarily baked is about 300 nm thick in the present embodiment.

As shown in FIG. 13(b), the precursor layer 326' is subsequently imprinted with the pressure of 8 MPa using a mold M5 (having the difference in height of 300 nm) which is concave in the region corresponding to the second electrode layer 326 forming part of the piezoelectric element 320, in order to pattern the functional solid material.

Similarly to the step of imprinting the ferroelectric layer precursor layer according to the modification example (3) of the first embodiment, the precursor layer 326' is imprinted in the state where the first heater 714 (close to the base 712)

and the second heater 724 (close to the mold) are heated. In this example, the highest temperature of the first heater 714 is 180° C. whereas the highest temperature of the second heater 724 is 180° C. The precursor layer 326' having the imprinted structure is formed through the imprinting step according to the present embodiment. In this imprinted structure, a convex portion is 300 nm thick whereas a concave portion is 50 nm thick, for example.

The precursor layer 326' is then entirely etched so that the precursor layer 326' is removed in the regions other than a region corresponding to the second electrode layer 326 (the entire etching step). The entire etching step is executed in accordance with the wet etching technique without adopting the vacuum process.

The precursor layer 326' is thereafter heat treated to be mainly baked for 10 minutes at 550° C. using the RTA device. As shown in FIG. 13(c), the second electrode layer 326 (possibly containing inevitable impurities; this applies to other oxide layers formed in accordance with the solution technique) is formed as the oxide layer containing lanthanum (La) and nickel (Ni). Formed through these steps is the piezoelectric element 320 that includes the first electrode layer 322, the piezoelectric layer 324, and the second electrode layer 326.

(2) Bonding Vibration Plate 350 and Piezoelectric Element 320

As shown in FIG. 13(d), the vibration plate 350 provided with the ink supply port 352 and the piezoelectric element 320 are bonded to each other using an adhesive agent.

(3) Formation of Cavity Component 340

As shown in FIG. 14(a), initially formed on the vibration plate 350 in accordance with the known spin coating technique is a functional solid material (quartz glass) precursor layer 340' (hereinafter, also simply referred to as the "precursor layer 340'") which is obtained from a functional solid material precursor solution as a start material containing metal alkoxide (isopropyl silicate ($Si(OC_3H_7)_4$)) as a solute.

The precursor layer 340' is then heated to be preliminarily baked in the atmosphere for about five minutes so as to reach 150° C. The precursor layer 340' thus preliminarily baked is about 10 μm to 20 μm thick in the present embodiment, for example.

As shown in FIG. 14(b), the precursor layer 340' is subsequently imprinted with the pressure of 8 MPa using a mold M6 that has a shape corresponding to the ink chamber 360, in order to pattern the functional solid material.

Similarly to the step of imprinting the ferroelectric layer precursor layer according to the modification example (3) of the first embodiment, the precursor layer 340' is imprinted in the state where the first heater 714 (close to the base 712) and the second heater 724 (close to the mold) are heated. In this example, the highest temperature of the first heater 714 is 180° C. whereas the highest temperature of the second heater 724 is 180° C. The precursor layer 340' having the imprinted structure is formed through the imprinting step according to the present embodiment. In this imprinted structure, a convex portion is 10 μm to 20 μm thick whereas a concave portion is 50 nm thick.

The precursor layer 326' is thereafter heat treated to be mainly baked for 10 minutes at 650° C. using the RTA device. As shown in FIG. 14(c), there is thus formed the cavity component 340 including the functional solid material layer (quartz glass).

(4) Bonding Cavity Component 340 and Nozzle Plate 330

As shown in FIG. 14(d), the cavity component 340 and the nozzle plate 330 provided with the nozzle opening 332 are bonded to each other using an adhesive agent.

(5) Detachment of Dummy Substrate 310

As shown in FIG. 14(e), the dummy substrate 310 is detached from the piezoelectric element 320. Produced through these steps is the piezoelectric ink jet head 300 according to the present embodiment.

Other Embodiments

The apparatus 700 for producing a functional device described in the first embodiment and the apparatus 800 for producing a functional device according to the modification example (8) are applicable to the other modification examples of the first embodiment as well as to the second embodiment.

The thin film transistor, the memory transistor, and the piezoelectric ink jet head are exemplified in the above embodiments. The production methods according to these embodiments are not limited to production of these devices. For example, in an embodiment for a method of producing a different functional device, the production methods according to these embodiments are applicable to a case of producing any optical device such as a reflective polarizing plate in which a substrate is provided thereon with a metal oxide ceramics layer or a metal layer in a latticed shape or to a case of producing a capacitor.

The above embodiments each include "the imprinting step" of imprinting upon formation of several oxide layers. The pressure applied in the imprinting step is not limited to 8 MPa as typically exemplified. As already described, at least part of the effects of the above embodiments can be exerted as long as the pressure in the imprinting step is in the range from 1 MPa to 20 Mpa.

Each of the precursor layers having high plastic deformability is imprinted in each of the above embodiments. Even in a case where a low pressure in the range from 1 MPa to 20 MPa is applied upon imprinting, each of the precursor layers is deformed so as to follow the shape of the surface of the mold, thereby accurately forming a desired imprinted structure. When the pressure is set to be in the low range from 1 MPa to 20 MPa, the mold is less likely to be damaged by imprinting and can be advantageously increased in area.

The above pressure is set to be in the range "from 1 MPa to 20 MPa" for the following reasons. Firstly, if the pressure is less than 1 MPa, each of the precursor layers may not be imprinted because the pressure is too low. Moreover, the precursor layer can be sufficiently imprinted by applying the pressure as high as 20 MPa, with no need to increase the pressure. In view of the above, in the imprinting step according to the modification examples (5) and (6), the imprinting is performed more preferably by applying a pressure in the range from 2 MPa to 10 MPa.

The "imprinting" in the imprinting step according to each of the embodiments includes both of partially imprinting a functional solid material precursor layer using a convexoconcave mold and entirely imprinting a functional solid material precursor layer using a flat mold.

In the imprinting step according to each of the embodiments, the apparatus 700 for producing a functional device or the apparatus 800 for producing a functional device can be replaced with an apparatus for producing a functional device. In this case, a substrate to be processed is attached to a surface of a roller and the roller is rotated on a mold having a flat plate shape provided with concave and convex portions so as to imprint the substrate. In a different possible aspect, the mold is attached to the surface of the roller. In this case, the surface of the roller itself can have a convexoconcave or flat plate mold, instead of attaching the mold to the surface of the roller.

As described above, the above embodiments have been disclosed not for limiting the present invention but for describing these embodiments. Furthermore, modification examples made within the scope of the present invention, inclusive of other combinations of the embodiments, will be also included in the scope of the patent claims.

FIG. 3
S101: Cause processing target to adhere to base and cause mold to be retained by fixing portion
S102: Controller shifts upper imprinting portion so as to press mold against functional solid material precursor layer
S103: Controller heats first heater and/or second heater and starts monitoring temperatures of heaters
S104: First temperature is higher than second temperature?
S105: Controller separates mold from functional solid material precursor layer after elapse of certain time period FIG. 5
S201: Cause processing target to adhere to base and cause mold to be retained by fixing portion
S202: Controller heats first heater and/or second heater and starts monitoring temperatures of heaters
S203: T1 is lower than T2?
S204: Controller shifts upper imprinting port n so as to press mold against functional solid material precursor layer
S205: Controller separates mold from functional solid material precursor layer after elapse of certain time period FIG. 7
1: Before main baking
2: After main baking
3: Width: 559 nm, height: 1 nm
4: Volume shrinkage factor: 24%

FIG. 8
1: Before main baking
2: After main baking
3: Width: 583 nm, height: 322 nm
4: Volume shrinkage factor: 54%

FIG. 9(a)
5: Precursor layer of metal, alkoxide
6: Spin coat
7: Bake
10: Denser film FIG. 9(b)
8: Precursor layer of metal organic acid salt
11: Sparser film FIG. 9(c)
9: Precursor layer from complex solution
12: Moderate (neither dense nor sparse) film

The invention claimed is:

1. A method of producing a functional device, the method comprising:
imprinting a functional solid material precursor layer obtained from a functional solid material precursor solution as a starting material, the functional solid material precursor layer obtained from the functional solid material precursor solution by baking the functional solid material precursor solution at a preliminary baking temperature in a range from 80° C. to 250° C., wherein a first temperature of a heat source for supplying heat to the functional solid material precursor layer is higher than a second temperature of the functional solid material precursor layer in at least part of a time period while a mold for forming an imprinted structure is pressed against the functional solid material precursor layer;
increasing the first temperature during at least a portion of the time period while the mold is pressed against the functional solid material precursor layer;
forming, after the imprinting step, a functional solid material layer from the functional solid material precursor layer by heat treating the functional solid material precursor layer at a third temperature higher than the first temperature in an atmosphere containing oxygen; and
causing a difference in temperature between the mold and a base upon which a substrate including the functional solid material precursor layer is mounted.

2. The method of producing a functional device according to claim 1, wherein
the heat source includes a heater for heating the mold.

3. The method of producing a functional device according to claim 1, wherein
the part of the time period corresponds to at least 20 when the mold is pressed for the time period corresponding to 100.

4. The method of producing a functional device according to claim 1, wherein
the first temperature is higher than the preliminary baking temperature and is in a range from 90° C. to 300° C.

5. The method of producing a functional device according to claim 1, wherein
the preliminary baking temperature in a preliminary baking step of forming the functional solid material precursor layer is lower than a boiling point of a solvent of the functional solid material precursor solution, and
the first temperature is higher than the boiling point of the solvent.

6. The method of producing a functional device according to claim 1, wherein
the imprinting step is executed by applying a pressure in a range from 1 MPa to 20 MPa.

7. The method of producing a functional device according to claim 1, wherein
the imprinting step includes at least one of a mold separation process from a surface of the functional solid material precursor layer and a mold separation process from an imprinting surface of the mold, and then imprinting the functional solid material precursor layer.

8. The method of producing a functional device according to claim 1, further comprising:
between the imprinting step and the functional solid material layer formation step, a step of entirely etching the functional solid material precursor layer under a condition where the functional solid material precursor layer is removed in a thinnest region in the imprinted functional solid material precursor layer.

9. The method of producing a functional device according to claim 1, wherein
the functional device is a thin film transistor, and
the functional solid material layer serves as at least one selected from the group consisting of a gate electrode layer, a gate insulating layer, a source layer, a drain layer, and a channel layer in the thin film transistor.

10. The method of producing a functional device according to claim 1, wherein
the functional device is a memory transistor, and
the functional solid material layer serves as at least one selected from the group consisting of a gate electrode layer, a ferroelectric layer, a source layer, a drain layer, and a channel layer in the memory transistor.

11. The method of producing a functional device according to claim 1, wherein
the functional device is a capacitor, and
the functional solid material layer serves as a dielectric layer and/or an electrode layer.

12. The method of producing a functional device according to claim 1, wherein
the functional device is an actuator including a piezoelectric layer, and
the functional solid material layer serves as the piezoelectric layer.

13. The method of producing a functional device according to claim 1, wherein
the functional device is an optical device including a base material provided thereon with a plurality of latticed layers, and
the functional solid material layer serves as the latticed layer.

14. The method of producing a functional device according to claim 1, wherein
the heat source includes a heater for heating the base.

15. The method of producing a functional device according to claim 14, wherein
the mold is higher in temperature than the base by at least 10° C.

16. The method of producing a functional device according to claim 1, wherein
the functional solid material precursor solution includes at least one selected from the group consisting of:
a solution containing metal alkoxide;
a solution containing a metal organic acid salt;
a solution containing a metal inorganic acid salt;
a solution containing metal halide;
a solution including an inorganic compound containing metal, nitrogen, and hydrogen; and
a solution containing metal hydride.

17. The method of producing a functional device according to claim 16, wherein
the functional solid material precursor solution includes at least one selected from the group consisting of the solution containing metal alkoxide, the solution containing a metal organic acid salt, and the solution containing a metal inorganic acid salt, and
in the imprinting step, the functional solid material precursor layer is transformed into the functional solid material layer at a volume shrinkage factor in a range from 20% to 80%.

18. The method of producing a functional device according to claim 16, wherein
the functional solid material precursor solution includes at least one selected from the group consisting of:
the solution containing metal halide;
the solution including an inorganic compound containing metal, nitrogen, and hydrogen; and
the solution containing metal hydride; and
in the functional solid material layer formation step, the functional solid material precursor layer is transformed into the functional solid material layer at a volume shrinkage factor in a range from 1% to 30%.

* * * * *